(12) United States Patent
Morishima

(10) Patent No.: US 7,339,850 B2
(45) Date of Patent: Mar. 4, 2008

(54) SEMICONDUCTOR MEMORY DEVICE ALLOWING HIGH-SPEED DATA READING

(75) Inventor: Chikayoshi Morishima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 287 days.

(21) Appl. No.: 11/178,430

(22) Filed: Jul. 12, 2005

(65) Prior Publication Data

US 2006/0023555 A1    Feb. 2, 2006

(30) Foreign Application Priority Data

Jul. 13, 2004  (JP)  .............................. 2004-206164
May 30, 2005  (JP)  .............................. 2005-157121

(51) Int. Cl.
*G11C 8/00* (2006.01)
*G11C 15/02* (2006.01)
*G11C 7/06* (2006.01)

(52) U.S. Cl. ..................... 365/230.03; 365/51; 365/63; 365/208; 365/154

(58) Field of Classification Search ..................... None
See application file for complete search history.

(56) References Cited

U.S. PATENT DOCUMENTS

| | | | | |
|---|---|---|---|---|
| 4,241,425 A | * | 12/1980 | Cenker et al. | .............. 365/222 |
| 4,555,778 A | | 11/1985 | Sakurai | |
| 5,014,246 A | * | 5/1991 | Komatsu et al. | ........ 365/230.03 |
| 6,388,937 B2 | | 5/2002 | Takeyama et al. | |
| 6,567,290 B2 | * | 5/2003 | Alexanian | .................... 365/63 |
| 7,009,910 B2 | * | 3/2006 | Ha | ........................ 365/230.06 |

FOREIGN PATENT DOCUMENTS

| | | |
|---|---|---|
| JP | 59-139193 | 8/1984 |
| JP | 02-003179 | 1/1990 |
| JP | 03-005993 | 1/1991 |
| JP | 06-119785 | 4/1994 |
| JP | 06-333389 | 12/1994 |
| JP | 10-106265 | 4/1998 |
| JP | 2002-184195 | 6/2002 |

* cited by examiner

*Primary Examiner*—Amir Zarabian
*Assistant Examiner*—Michael Weinberg
(74) *Attorney, Agent, or Firm*—McDermott Will & Emery LLP

(57) ABSTRACT

Each of a plurality of memory blocks arranged for 1 bit data is divided into two subarrays. A separate local data line is provided for each subarray and coupled to a sense amplifier via an isolation gate. A memory cell is selected in a selected subarray of a selected memory block, and a bit line of the selected memory cell is coupled to a corresponding local data line. Only a local data line of the selected subarray is coupled to the sense amplifier to perform a sense operation, and a global read data line is driven via a read driver in accordance with an output signal of the sense amplifier. A load of a sense node of the sense amplifier in a semiconductor memory device is reduced to implement high-speed reading of internal data.

4 Claims, 16 Drawing Sheets

(TO ROW DECODE CIRCUIT XD): XD IS ACTIVATED WITH ICLK, BS (OR BSCU/L)

SEMICONDUCTOR MEMORY DEVICE ALLOWING HIGH-SPEED DATA READING

BACKGROUND OF THE INVENTION

1. Field of the Invention

The present invention relates to a semiconductor memory device, in particular, to a static semiconductor memory device (SRAM: Static Random Access Memory). More specifically, the present invention relates to a construction of an internal data read and data transfer portion of the SRAM.

2. Description of the Background Art

An SRAM has a memory cell formed with a latch circuit, and complementary data are kept at storage nodes inside the memory cell. Therefore, an SRAM cell can stably store data while power is supplied, and refreshing of stored data is not required in contrast to a construction of a DRAM (Dynamic Random Access Memory), which in turn stores information according to electric charges of a capacitor. Thus, the SRAM is controlled more easily than the DRAM, and is widely used in various processing systems.

In addition, since memory cell data can be accurately read from the SRAM even when a row and a column (a word line and a bit line) are selected at the same time, the SRAM allows high-speed access and has a shorter cycle time as compared with the DRAM, and is widely used as a high-speed memory such as a cache memory.

As processing systems become faster in recent years, further high-speed access is required for various memories including the SRAM. Prior art document 1 (Japanese Patent Laying-Open No. 06-333389) shows an example of a construction for implementing such speedup of a semiconductor memory device.

Prior art document 1 discloses a construction for speeding up data reading in a DRAM. Specifically, in the construction described in prior art document 1, a voltage level of a column selection signal is boosted to a level higher than an internal power supply voltage for connecting a bit line (sense amplifier) of a selected column to a common data line through a low resistance, in order to increase a transconductance, gm, of a column selection gate for connecting the selected column to the common data line.

In the construction described in prior art document 1, a memory array is formed into a block division structure so as to divide a bit line, and a sense amplifier is arranged between divided bit lines to form a so-called "shared sense amplifier" construction. For implementing high-speed reading, a load of the bit line is reduced, a read voltage of a memory cell to the sense amplifier is increased, and in addition, memory cell data is transferred to the sense amplifier at a high speed.

Further, prior art document 2 (Japanese Patent Laying-Open No. 06-119785) shows a construction aiming speed up of a sense amplifier in a data read portion of the SRAM. In the construction described in prior art document 2, a bit line pair of a selected column is coupled to internal data lines. A variation of a signal on the internal data line is detected with a current mirror type sense amplifier. In prior art document 2, current mirror sense amplifier is provided in two stages, in order to obtain a symmetric waveform of a read signal of the sense amplifier. Complementary mirror currents are generated in a first stage sense amplifier according to complementary signals of an internal data line pair, and the complementary mirror currents are used to drive a second stage sense amplifier to transfer final read data to a main amplifier or an output buffer.

In prior art document 2, a bus load circuit for limiting a signal amplitude of an internal data bus line is also arranged to limit the signal amplitude to implement a high-speed internal data transfer.

Prior art document 3 (Japanese Patent Laying-Open No. 59-139193) shows a construction for reading data at a high speed, in which an internal data line is provided for each of two memory planes, and the internal data line provided for a selected memory plane is connected to a sense amplifier via a switch circuit. In the construction described in prior art document 3, a memory mat is divided into two memory planes in a row direction, and each memory plane includes static memory cells arranged in rows and columns. The internal data line pair is arranged corresponding to each memory plane. A bit line pair of a selected column is coupled to the corresponding internal data lines through a column selection circuit of the selected memory plane. Then, the internal data line is coupled to the sense amplifier via the switch circuit to read data. With a division structure of the internal data line, the number of column selection gates in the column selection circuit connected to each internal data line is decreased, and a parasitic capacitance of the internal data line is correspondingly decreased to transmit read data from a selected bit line to the sense amplifier at a high speed.

Prior art document 4 (Japanese Patent Laying-Open No. 10-106265) shows a construction intended to speed up writing and reading of data. In the construction disclosed in prior art document 4, a memory mat is divided into two memory blocks along a bit line direction. A common bit line (an internal data line) is arranged for each memory block, and a bit line of a selected column is coupled to a corresponding common bit line. A sense amplifier and a write driver are arranged in common to the memory blocks. The common bit line of a selected memory block is selected by a selection circuit and coupled to the sense amplifier and the write driver.

With a division structure of the bit line in prior art document 4, the number of memory cells connected to one bit line is decreased, and a bit line load is correspondingly decreased. Charging and discharging (including precharging) of the bit line are performed faster due to this decreased bit line load, and an access time is decreased.

In the construction described in prior art document 1, a connection resistance between the selected column and the common data line in the shared sense amplifier construction of the DRAM is decreased. In the DRAM, however, sense amplifiers are arranged corresponding to the respective memory cell columns (bit line pairs), and each bit line pair of a selected memory block is coupled to a corresponding sense amplifier via a bit line isolation gate. The sense amplifier (bit line pair) of the selected column is coupled to the common data line through the column selection gate. The common data line is arranged extending for a long distance to transfer internal read data to an output buffer circuit, and has a large load. In addition, a main amplifier for amplifying the internal read data and a write driver for writing data are further connected to the common data line, and therefore the load becomes large.

Prior art document 1 merely describes the construction in which the bit line pair (sense amplifier) of the selected column is connected to the common data line through a low resistance, and an effect of the load of the common data line on data reading as well as a construction for decreasing the load of the common data line are not considered. In the SRAM, the sense amplifier is coupled to the bit line pair of a selected column via the internal data line. Therefore, the SRAM sense amplifier itself has to amplify, at a high speed, a signal amplitude corresponding to memory cell data appearing on the internal data line. As described above, the internal data line has the write driver and others are coupled thereto and is large in load. Therefore, the shared sense amplifier construction of the DRAM as described in prior art document 1 cannot be simply applied to a portion of a sense amplifier of the SRAM.

In addition, in the DRAM, after memory cell data are amplified and latched by the sense amplifiers, a column selection operation is performed and the bit line pair (sense amplifier) of a selected column is coupled to the common data line. Therefore, the construction of the DRAM sense amplifier of prior art document 1 cannot be applied to the construction of the SRAM in which a signal amplitude corresponding to memory cell data of a selected column is transmitted to and amplified by the sense amplifier to generate an internal read data.

In the construction described in prior art document 2, a plurality of stages of sense amplifiers are cascaded to generate internal read data having a symmetric signal waveform for transferring internal data of a small amplitude. Prior art document 2 also shows a block division structure in which the internal data bus is arranged in common to a plurality of memory blocks and memory cell data of a selected block is read. A local data line is arranged in each block, and such local data line is driven according to the memory cell data by a read amplifier having a function of column selection, and a signal of the local data line is further amplified by a local sense amplifier. A block read amplifier for a selected memory block is activated to drive a common internal data line according to an output signal of a corresponding local sense amplifier.

A block read amplifier is arranged on the common internal data line corresponding to each memory block, and a load of each block read amplifier is coupled to the common internal data line. The common internal data line is coupled to a sense main amplifier for generating final internal data. In the construction described in prior art document 2, in order to generate data of a symmetric signal waveform, a main amplifier is coupled to a common internal data bus having a large load in parallel with a sense amplifier for generating complementary currents according to a voltage of the common data line. Prior art document 2 does not consider a reduction in a load of the common internal data bus in the construction in which the memory array is formed into the block division structure and a selected block transmits the internal read data to the sense amplifier via the common data line. In other words, prior art document 2 intends only shaping of a signal waveform to perform an internal data transfer at a high speed regardless of a variation in sense amplifier load, and does not consider a problem of a data transfer speed when the internal data bus has a large load, or a construction for speeding up data reading by reducing the load of the internal data bus.

In the construction disclosed in prior art document 3, two memory planes are arranged along a word line direction, and the internal data line arranged corresponding to the selected memory plane is coupled to the sense amplifier. Therefore, since the memory plane is not divided in a bit line direction in this construction, when the number of memory cells is increased in the bit line direction, a bit line load is accordingly increased and therefore high-speed reading cannot be implemented.

Prior art document 3 merely considers forming of the internal data line into a division structure to reduce the load of the internal data line, and does not consider reduction in the bit line load for the sense amplifier.

In the construction disclosed in prior art document 4, the memory mat is divided into two memory blocks, and a common data line selection circuit and a sense amplifier/write driver are arranged between the two memory blocks. Therefore, the bit line load can be halved with the bit line division structure as compared with a bit line non-division structure. When the number of the memory cells is further increased, however, the load of the bit line is accordingly increased and thus high-speed writing/reading of data cannot be implemented. Although prior art document 4 describes a divided-in-two structure for the bit line, a problem of increase in bit line load when the number of the memory cells is further increased in the bit line direction is not considered.

SUMMARY OF THE INVENTION

An object of the present invention is to provide a semiconductor memory device enabling high-speed data reading by reducing a load of an internal data bus connected to a sense amplifier.

Another object of the present invention is to provide a static semiconductor memory device which can transfer internal read data at a high speed without increasing a chip layout area.

A semiconductor memory device according to a first aspect of the present invention includes a plurality of memory blocks, arranged in alignment with each other, each having memory cells arranged in rows and columns. Each memory block includes first and second subarrays each including static memory cells arranged in rows and columns and a plurality of bit line pairs, arranged corresponding to the respective memory cell columns, each connected with memory cells of a corresponding column.

The semiconductor memory device according to the first aspect of the present invention further includes a sense amplifier arranged for each memory block in common to the first and second subarrays, for differentially amplifying potentials of first and second sense nodes when activated, a first data line pair arranged corresponding to the first subarray for each memory block, a second data line pair arranged corresponding to the second subarray for each memory block, a first column selection circuit arranged corresponding to the first subarray for each memory block, for coupling a bit line pair of a selected column of the first subarray to the first data line pair according to a received column selection signal when the first subarray is selected, a second column selection circuit arranged corresponding to the second subarray for each memory block, for coupling a bit line pair corresponding to a selected column of the second subarray to the second data line pair according to a received column selection signal when the second subarray is selected, a first connection control circuit for coupling the first data line pair to the first and second sense nodes of the sense amplifier according to at least a subarray selection signal for each memory block, a second connection control circuit for coupling the second data line pair to the first and second sense nodes of the sense amplifier according to at least the subarray selection signal for each memory block, and a global read data line arranged in common to the sense amplifier of each of the plurality of memory blocks for transferring data from a selected sense amplifier.

A semiconductor memory device according to a second aspect of the present invention includes a plurality of memory blocks arranged corresponding to one data bit. Each of the plurality of memory blocks includes first and second subarrays each including a plurality of static memory cells arranged in rows and columns and a plurality of bit line pairs, arranged corresponding to the respective memory cell columns, each connected with memory cells of a corresponding column.

The semiconductor memory device according to the second aspect of the present invention further includes first and second data line pairs arranged respectively corresponding to the first and second subarrays for each memory block, a first column selection circuit arranged corresponding to the first subarray for each memory block, for coupling a bit line pair of a selected column of the first subarray to the first data line pair according to a received column selection signal, a second column selection circuit arranged corresponding to the second subarray for each memory block, for coupling a bit line pair of a selected column of the second subarray to the second data line pair according to a received column selection signal, a data line selection circuit arranged in a column circuit region arranged between the first and second subarrays in alignment with the first and second subarrays for each memory block, for selecting one of the first and second data line pairs according to at least a subarray selection signal, a sense read circuit arranged, for each memory block, in the column circuit region between the first and second subarrays, for amplifying data received from a data line selected by the data line selection circuit when activated, an internal write circuit arranged, for each memory block, in the column circuit region between the first and second subarrays, for transmitting internal write data to a data line pair selected by the data line selection circuit, and a global data bus arranged in common to the plurality of memory blocks and coupled in common to the sense read circuit and the internal write circuit of each memory block, for transferring internal data.

Each memory block is divided into subarrays for which data lines are provided, respectively, and the data line for a selected subarray is coupled to the sense node of a sense amplifier. Therefore, only a capacitance of a column selection gate (arranged corresponding to each bit line pair) of a column selection circuit of a corresponding subarray and a bit line load are connected to the data line, which can reduce a load of the data line of the sense amplifier and can provide a similar effect of reduction of a bit line load in a bit line division structure on an internal data line, to allow implementation of high-speed data reading even when the number of memory cell rows is increased.

In addition, by arranging a plurality of memory blocks for one bit of data, dividing each memory block into first and second subarrays and arranging a sense read circuit and an internal write circuit between the first and second subarrays, a length of the bit line can be decreased even when the number of memory cells is increased and, correspondingly, the bit line load is reduced while a load of the internal data line is similarly reduced to allow implementation of high-speed writing/reading. Furthermore, only sense read circuits and internal write circuits corresponding in number to the memory blocks are connected to the global data bus, which in turn has a small load and can transfer internal data at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
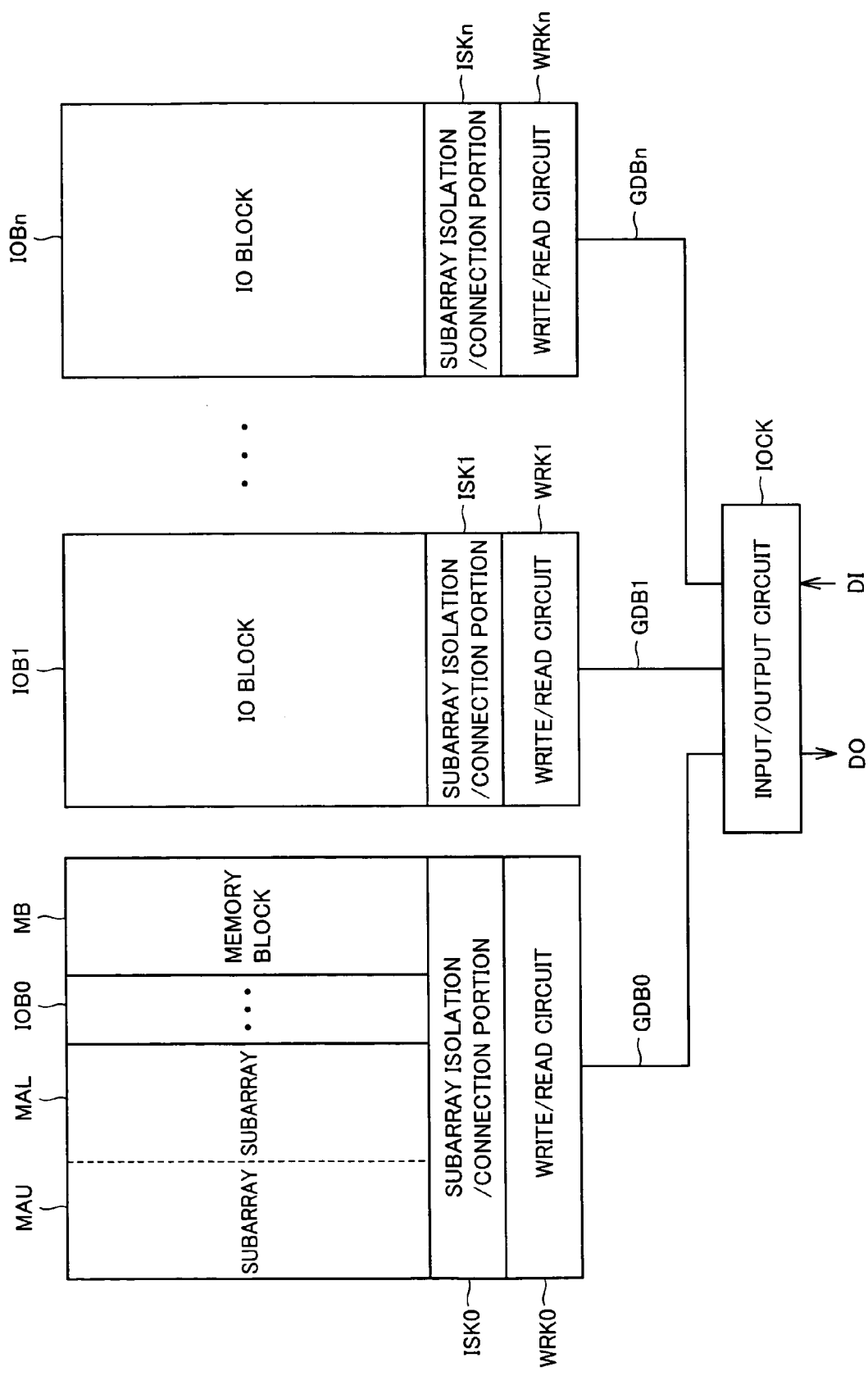
FIG. 1 schematically shows a whole construction of a semiconductor memory device according to the present invention.

FIG. 1 is a conceptual diagram of a construction of a main portion of a semiconductor memory device according to a first embodiment of the present invention. In FIG. 1, a memory array is divided into a plurality of IO blocks IOB0-IOBn. Each of IO blocks IOB0-IOBn corresponds to one bit of external input data DI and external output data DO. IO blocks IOB0-IOBn concurrently input and output data.

Each of IO blocks IOB0-IOBn is divided into a plurality of memory blocks MBs. Memory block MB in IO block IOB0 is representatively shown in FIG. 1. Memory block MB is further divided into subarrays MAU and MAL. One memory block MB is selected in each of IO blocks IOB0-IOBn, and one of subarrays MAU and MAL in a selected memory block is further selected.

IO blocks IOB0-IOBn, respectively, include write/read circuits WRK0-WRKn for writing/reading internal data and subarray isolation/connection portions ISK0-ISKn for performing isolation/connection of write/read circuits WRK0-WRKn for selected subarrays. As described below in detail, each of subarrays MAU and MAL has a construction in which memory cells are arranged in rows and columns, and a bit line pair is connected corresponding to each memory cell column. Bit line of selected subarrays are connected via corresponding subarray isolation/connection portions ISK0-ISKn to respective write/read circuits WRK0-WRKn, and a load of each of write/read circuits WRK0-WRKn, particularly a load of a sense node of a sense amplifier forming a read circuit is reduced to implement high-speed data reading.

In addition, since a bit line is formed into a division structure for each subarray in each IO block, a bit line load can be reduced to allow high-speed charging and discharging of the bit line to implement high-speed access.

Furthermore, in each IO block, the number of rows of memory cells can be increased by increasing the number of memory blocks, which can suppress an increase in the bit line load and, accordingly, can reduce a load of a local data line (an internal data line; a sense node) to achieve a high-speed sense operation.

In addition, a storage capacity can also be changed by changing the number of memory blocks, which facilitates adaptation to a change in memory specification and improves efficiency of designing.

Write/read circuits WRK0-WRKn are coupled to an input/output circuit IOCK via global data buses GDB0-GDBn, respectively. Each of global data buses GDB0-GDBn may be formed into an IO isolation structure, in which internal write data and internal read data are transferred via separate data lines, or in a common IO line structure, in which internal write data and internal read data are transmitted via a common data line.

Input/output circuit IOCK communicates input data DI or output data DO with IO blocks IOB0-IOBn. Data DI and DO are multi-bit data including a data bit corresponding to each of IO blocks IOB0-IOBn.

Figure 2:
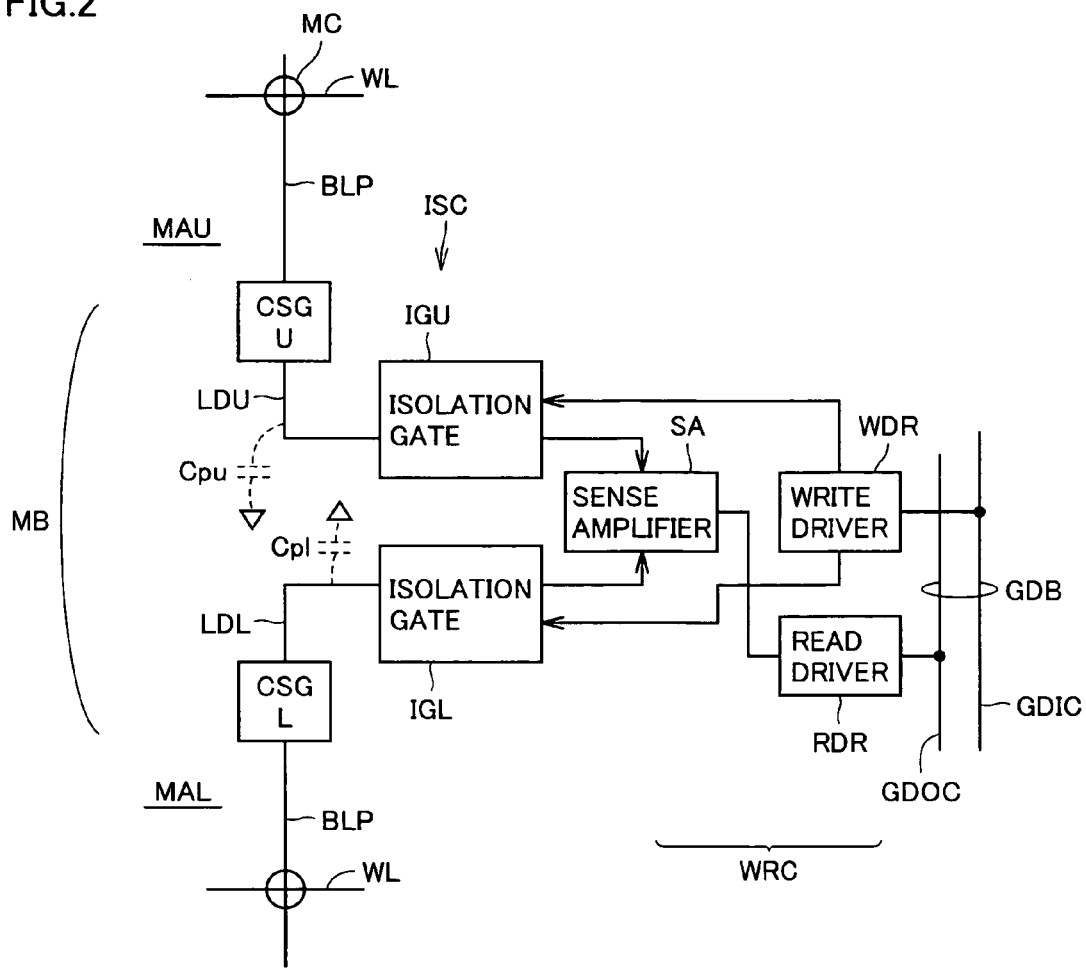
FIG. 2 schematically shows a construction of a subarray isolation/connection portion of the semiconductor memory device shown in FIG. 1.

FIG. 2 is a conceptual diagram of a construction of a main portion of the semiconductor memory device according to the first embodiment of the present invention. In FIG. 2, memory block MB is divided into subarrays MAU and MAL. In each of subarrays MAU and MAL, memory cells MCs are arranged in rows and columns, and a word line WL is arranged corresponding to each memory cell row, and a bit line pair BLP is arranged corresponding to each memory cell column. In FIG. 2, one bit line pair BLP and one word line WL, together with memory cell MC arranged corresponding to a crossing thereof, are representatively shown in each of subarrays MAU and MAL.

Bit line pair BLP of subarray MAU is coupled to a local data line pair LDU via a column selection gate CSGU, and bit line pair BLP of subarray MAL is coupled to a local data line pair LDL via a column selection gate CSGL.

When memory block MB is selected, a column selection gate of a subarray including a selected memory cell is made conductive according to a column address signal, to connect bit line pair BLP of a selected column to a corresponding local data line pair LDU or LDL.

Local data line pairs LDU and LDL are coupled to a sense amplifier SA and a write driver WDR via respective isolation gates IGU and IGL. Isolation gates IGU and IGL are included in a subarray isolation/connection portion ISK (ISK0-ISKn) shown in FIG. 1. Each of isolation gates IGU and IGL couples a local data line pair of a selected subarray to sense amplifier SA and write driver WDR. Write driver WDR generates write data for a selected memory cell according to internal write data on a global write data line GDIC when memory block MB is selected. An output signal of sense amplifier SA is transmitted to a global read data line GDOC via a read driver RDR. These global write data line GDIC and global read data line GDOC correspond to a global data bus GDB (GDB0-GDBn) shown in FIG. 1. FIG. 2 shows as an example a global data bus having a separated 10 structure, in which write data line and read data line are separately provided. Global data bus GDB may be a bus having a common IO structure.

As shown in FIG. 2, the local data line pair of the selected subarray is coupled to sense amplifier SA using isolation gates IGU and IGL. The subarray not selected is isolated from the sense amplifier. Therefore, only one of parasitic capacitances Cpu and Cpl of local data line pairs LDU and LDL is coupled to sense amplifier SA, which reduces a load of a sense node of sense amplifier SA and enables a sense node potential of sense amplifier SA to change at a high speed.

In particular, by connecting isolation gates IGU and IGL also to write driver WDR, a load of write driver WDR to sense amplifier SA can be isolated, which can further reduce the load of sense amplifier SA. In the SRAM, particularly, a sense amplifier, a read amplifier and a write driver are arranged in this isolation/connection portion, and a sense amplifier arrangement region between subarrays occupies a large area. Therefore, if the local data line is arranged in common to subarrays MAU and MAL, an interconnection thereof becomes long to have an increased load. As a result, the effect of reducing the bit line load by connecting the bit line in the division structure to the sense amplifier would be impaired due to the increased load of the local data line. The local data line is provided in the division structure for each subarray and only the selected subarray is connected to the sense amplifier. With this divided local data line structure, the load of the local data line to sense amplifier SA can be reduced and an effect of the bit line division structure can be fully exhibited.

In addition, even when the number of memory cell rows is increased, the number of memory blocks can be increased to suppress an increase in the bit line load of each memory block to achieve high-speed data reading. Although the global read data line becomes longer, only the read driver is coupled thereto to provide a very slight increase in the load of the global read data line. In addition, global read data line GDOC can be driven at a high speed with the read driver. A construction of each portion will now be described in detail.

Figure 3:
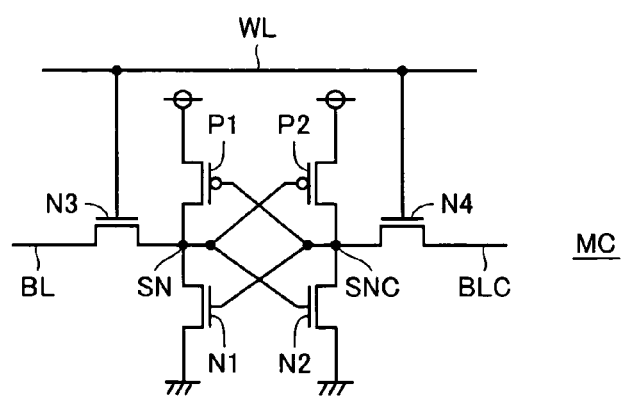
FIG. 3 shows an example of a construction of a memory cell MC shown in FIG. 2.

FIG. 3 shows an example of a construction of memory cell MC used in the semiconductor memory device according to the present invention. In FIG. 3, memory cell MC includes a P channel MOS (insulated gate field effect) transistor P1 connected between a power supply node and a storage node SN and having the gate connected to a storage node SNC, a P channel MOS transistor P2 connected between the power supply node and storage node SNC and having the gate connected to storage node SN, an N channel MOS transistor N1 connected between storage node SN and a ground node and having the gate connected to storage node SNC, an N channel MOS transistor N2 connected between storage node SNC and the ground node and having the gate connected to storage node SN, and N channel MOS transistors N3 and N4 for connecting storage nodes SN and SNC to bit lines BL and BLC, respectively, in response to a signal potential on word line WL.

These MOS transistors P1, P2, N1, and N2 form a so-called inverter latch circuit for latching complementary data on storage nodes SN and SNC. Memory cell MC is a static memory cell having a full CMOS construction and holds complementary data on storage nodes SN and SNC while a power supply voltage is supplied to the power supply node.

In data reading, word line WL is driven into a selected state and, accordingly, MOS transistors N3 and N4 are made conductive and potential change corresponding to stored data of storage nodes SN and SNC are generated complementarily on bit lines BL and BLC. The potential changes on bit lines BL and BLC are transferred to and amplified by sense amplifier SA shown in FIG. 2.

Figure 4:
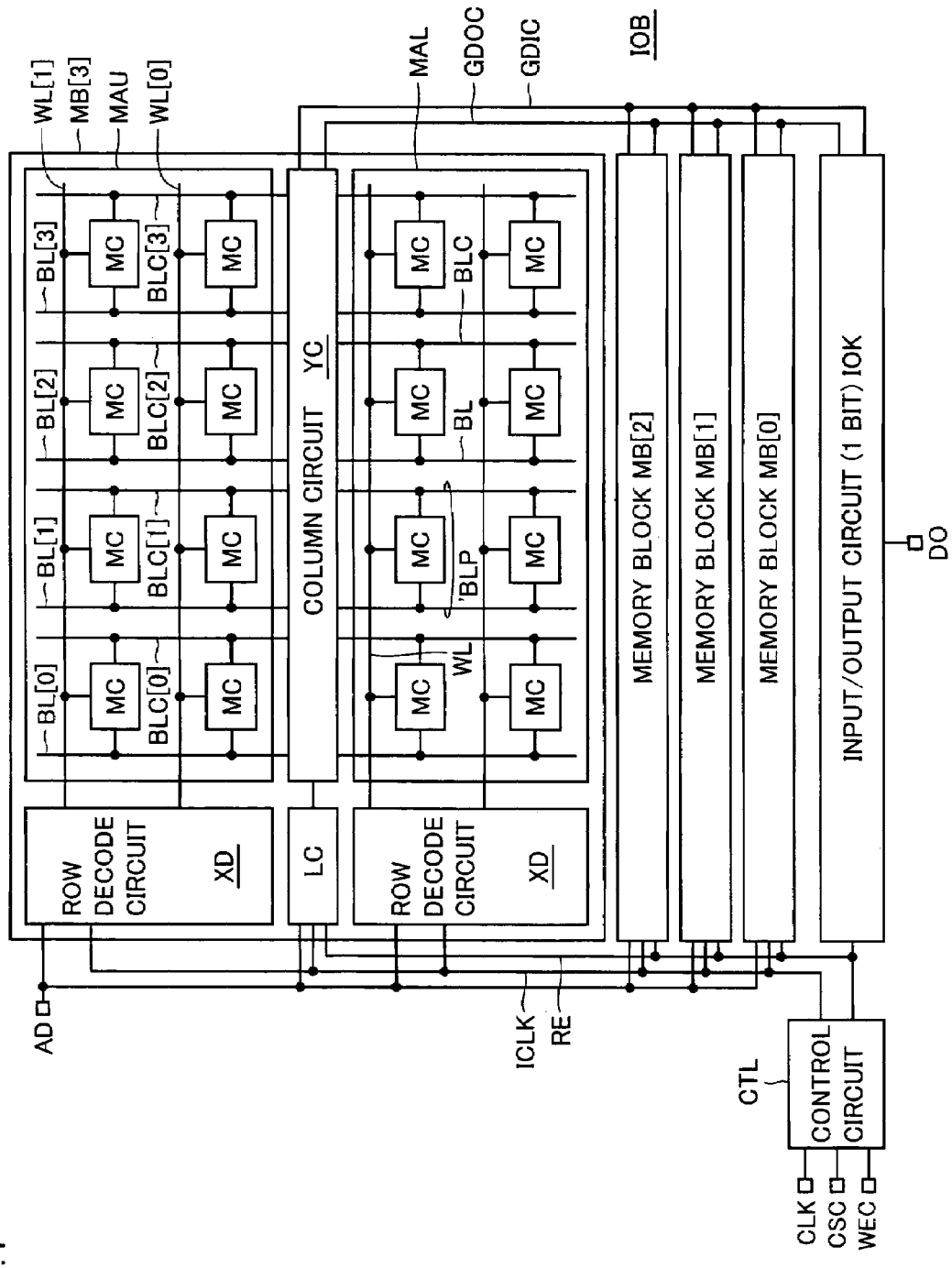
FIG. 4 schematically shows a construction of an IO block shown in FIG. 1.

FIG. 4 schematically shows an example of a construction of IO block IOB of a semiconductor memory device according to the first embodiment of the present invention. In FIG. 4, IO block IOB includes, as an example, four memory blocks MB[0]-MB[3]. Since each of memory blocks MB[0]-MB[3] has the same construction, the construction of memory block MB[3] is representatively shown in FIG. 4 and the other memory blocks MB[0]-MB[2] are shown only as blocks. Memory blocks MB[0]-MB[3] are commonly coupled to global data lines GDOC and GDIC.

Memory block MB[3] includes two subarrays MAU and MAL. In each of subarrays MAU and MAL, memory cells MCs are arranged in rows and columns, and a bit line pair is arranged corresponding to each column of memory cells MCs while word line WL is arranged corresponding to each row of the memory cells. In FIG. 4, memory cells MCs arranged in four columns and two rows in each of subarrays MAU and MAL are shown as an example. Word lines WL[0] and WL[1] are arranged corresponding to the respective rows of memory cells MCs. Bit line pairs include bit lines BL[0], BLC[0]-BL[3], BLC[3] arranged corresponding to the respective columns of memory cells MCs. In subarray MAL, word lines and bit line pairs are similarly arranged corresponding to memory cell rows and memory cell columns, respectively, for memory cells MCs arranged in four columns and two rows. To avert complication of the drawing, characters of bit line pair BLP, bit lines BL, BLC and word line WL in memory subarray MAL are representatively shown in FIG. 4.

For each of subarrays MAU and MAL, a row decode circuit XD is provided for driving word line WL into a selected state according to an applied address signal. A column circuit YC is provided between subarrays MAU and MAL, for reading memory cell data of a selected subarray and writing data to the selected memory cell. Column circuit YC of each of memory blocks MB[0]-MB[3] is commonly coupled to global data lines GDOC and GDIC and transfers internal data to an input/output circuit IOK. Input/output circuit IOK indicates a portion of input/output circuit IOCK shown in FIG. 1, and inputs and outputs data of 1 bit.

Column circuit YC is included in subarray isolation/connection portion ISK and write/read circuit WRK shown in FIG. 1, and arranged between subarrays MAU and MAL corresponding to memory block MB. Specifically, subarray isolation/connection portion ISK and write/read circuit WRK shown in FIG. 1 are arranged as column circuit YC corresponding to each memory block in a divided and dispersed manner. Therefore, column circuit YC, having a construction as described below in detail, implements functions of subarray isolation/connection and writing/reading.

For controlling operations of memory blocks MB[0]-MB[3], a control circuit CTL is provided for generating an internal clock signal ICLK, a read enable signal RE and an internal write designation signal (not shown) according to an externally applied clock signal CLK, a chip select signal CSC indicating this semiconductor memory device being selected, and a write signal WEC instructing data writing. Internal clock signal ICLK and read enable signal RE from control circuit CTL are applied together with an address signal AD to a local control circuit LC provided for each of memory blocks MB[0]-MB[3]. Although the internal write designation signal is also applied to local control circuit LC for control of writing for each block, a path of the write designation signal (write enable signal) is not shown in FIG. 4.

In data reading, local control circuit LC selectively activates column circuit YC according to a memory block selection signal and a subarray selection signal included in address signal AD at a timing determined by internal clock signal ICLK and read enable signal RE.

By providing subarrays MAU and MAL and arranging column circuit YC therebetween in each of memory blocks MB[0]-MB[3], bit lines BL and BLC extend only in each of subarrays MAU and MAL to implement the bit line division structure, with which the bit line is made shorter, the number of memory cells connected to a bit line is decreased and the bit line load is reduced.

Furthermore, by connecting only the selected subarray to the sense amplifier and the write driver in column circuit YC under control of local control circuit LC, a drive load of the column circuit is further reduced.

In data reading, input/output circuit IOK generates external read data DO according to a signal on global read data line GDOC in response to activation of read enable signal RE from control circuit CLT.

Figure 5:
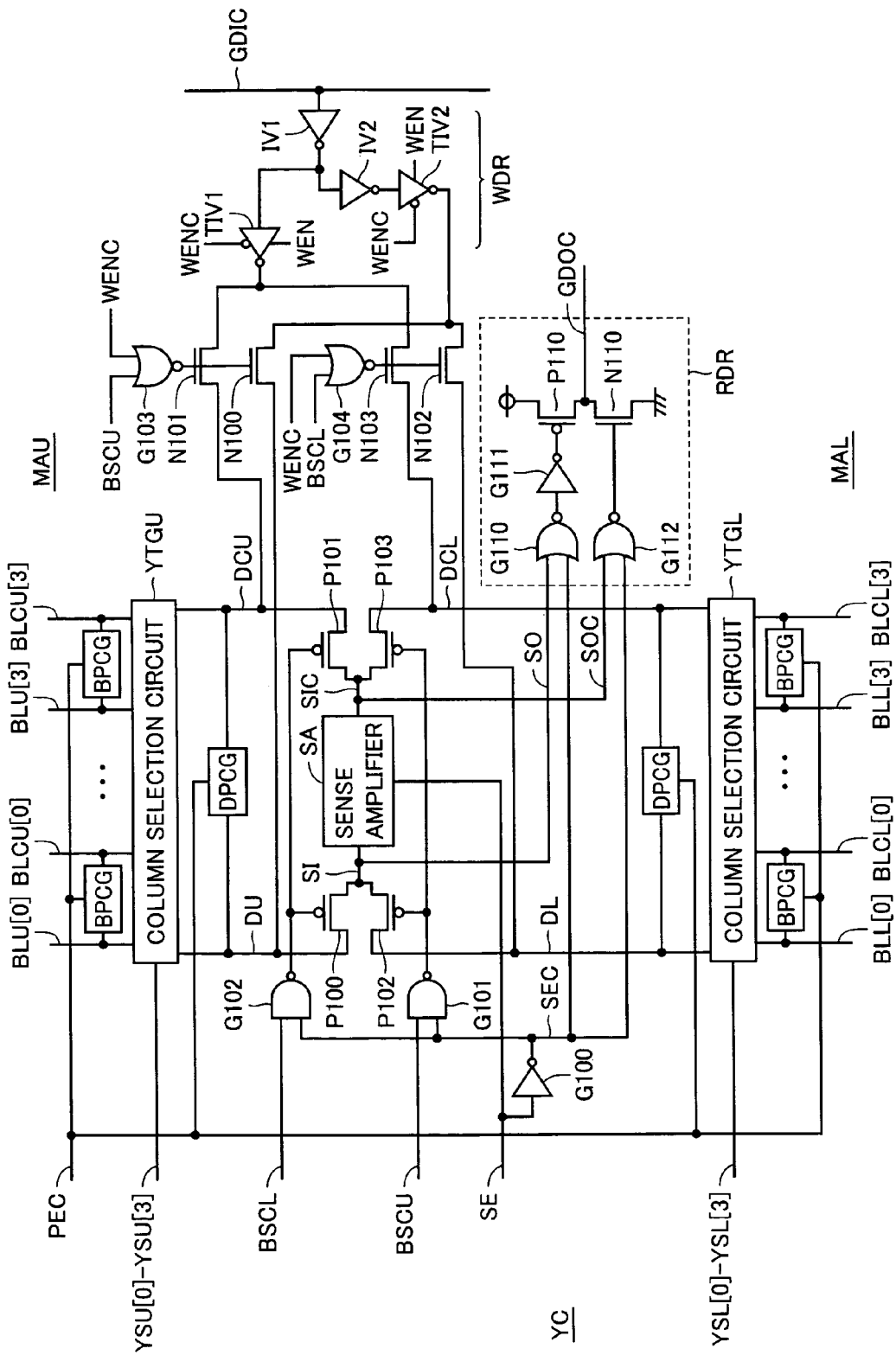
FIG. 5 shows an example of a construction of a column circuit shown in FIG. 4.

FIG. 5 schematically shows a construction of column circuit YC shown in FIG. 4. Column circuit YC includes a bit line precharge circuit BPCG provided for each of bit line pairs BLU[0], BLCU[0]-BLU[3], BLCU[3] of subarray MAU, a bit line precharge circuit BPCG provided for each of bit line pairs BLL[0], BLCL[0]-BLL[3], BLCL[3] of subarray MAL, a column selection circuit YTGU for selecting a bit line pair of subarray MAU according to column selection signals YSU[0]-YSU[3] and coupling the selected bit line pair to local data lines DU and DCU, and a column selection circuit YTGL for selecting a bit line pair on a designated column of subarray MAL according to column selection signals YSL[0]-YSL[3] and coupling the selected bit line pair to local data lines DL and DCL. Local data line pair LDU shown in FIG. 2 corresponds to local data lines DU and DCU, and local data line pair LDL shown in FIG. 2 corresponds to local data lines DL and DCL.

When a precharge designation signal PEC is activated, bit line precharge circuit BPCG precharges corresponding bit lines to a predetermined level such as a power supply potential level.

Column selection circuits YTGU and YTGL couple corresponding bit line pairs to local data lines DU, DCU and DL, DCL when corresponding column selection signals YSU[0]-YSU[3] and YSL[0]-YSL[3] are driven into the selected state. By separately providing local data lines DU and DCU for subarray MAU and local data lines DL and DCL for subarray MAL as local data lines, loads of the local data lines are reduced.

A data line precharge circuit DPCG is provided between local data lines DU and DCU, and a data line precharge circuit DPCG is also provided between local data lines DL and DCL for precharging these local data lines. Data line precharge circuit DPCG precharges a corresponding local data line to a predetermined potential level in response to activation of precharge designation signal PEC in a similar manner as bit line precharge circuit BPCG.

Column circuit YC further includes, as an isolation and connection control circuit, an inverter G100 inverting a sense activation signal SE, an NAND gate G101 receiving an output signal SEC of inverter G100 and a subarray specifying signal BSCU, an NAND gate G102 receiving output signal SEC of inverter G100 and a subarray specifying signal BSCL, P channel MOS transistors P100 and P101 which are made conductive when an output signal of NAND gate G102 is at the L (logical low) level, to couple local data lines DU and DCU to sense nodes SI and SIC, respectively, and P channel MOS transistors P102 and P103 which are made conductive when an output signal of NAND gate G101 is at the L level, to couple local data lines DL and DCL to sense nodes SI and SIC, respectively.

Subarray specifying signals BSCL and BSCU forming the subarray selection signal respectively specify subarrays MAL and MAU, when activated.

Sense amplifier SA coupled to sense nodes SI and SIC is formed with, for example, a latch type sense amplifier, and when sense activation signal SE is activated, it differentially amplifies potentials of sense nodes SI and SIC to generate complimentary signals SO and SOC. Sense amplifier SA may also be formed with a current mirror-type sense amplifier.

Data line precharge circuits DPCGs are provided for local data lines DU, DCU and local data lines DL, DCL, respectively, and are precharged to a predetermined potential level by corresponding data line precharge circuits DPCG when precharge designation signal PEC is activated. By arranging the data line precharge circuits to these local data line pairs, loads of local data lines for subarrays MAU and MAL can be equalized, a sense operation can be started at the same timing regardless of the selected subarray, and a sense margin can be made larger.

Since P channel MOS transistors P100-P103 are utilized to control connections of the local data lines with sense amplifier SA, a data line potential can be transmitted to sense nodes SI and SIC without a loss of a threshold voltage of the MOS transistor even when local data lines DU, DCU and DL, DCL are precharged to, for example, a power supply voltage level.

Read driver RDR is enabled when an output signal of inverter G100 is activated (at the L level), and drives global read data line GDOC according to complimentary output signals SO and SOC of sense amplifier SA.

Read driver RDR includes an NOR gate G110 receiving a signal SO of sense node SI and a complemental sense activation signal SEC output from inverter G100, an NOR gate G112 receiving a signal SOC of sense node SIC and complemental sense activation signal SEC, an inverter G1 inverting an output signal of NOR gate G110, a P channel MOS transistor P110 for coupling global read data line GDOC to the power supply node when an output signal of inverter G111 is at the L level, and an N channel MOS transistor N110 which is made conductive, when an output signal of NOR gate G112 is at the H level, to couple global read data line GDOC to the ground node.

When complemental sense activation signal SEC is at the H level and sense amplifier SA is in an inactive state, output signals of NOR gates G110 and G112 are both at the L level, MOS transistors P110 and N110 are set to an OFF state, and read driver RDR is in an output high impedance state. When complemental sense activation signal SEC is set to the L level, NOR gates G110 and G112 operate as inverters to set one of MOS transistors P110 and N110 to an ON state according to output signals SO and SOC of sense amplifier SA, to drive global read data line GDOC to the power supply potential or the ground voltage.

Write driver WDR includes an inverter IV1 receiving a signal on global write data line GDIC, an inverter IV2 inverting an output signal of inverter IV1, a tristate inverter TIV1 inverting the output signal of inverter IV1 in response to activation of complementary write activation signals WENC and WEN, and a tristate inverter TIV2 activated in response to activation of complementary write activation signals WEN and WENC to invert an output signal of inverter IV2. Tristate inverters TIV1 and TIV2 are in an output high impedance state when not activated. By connecting only one inverter IV1 to global write data line GDIC in one memory block, a load of global write data line GDIC is reduced.

A write data transfer portion of each of isolation gates IGU and IGL shown in FIG. 2 includes an NOR gate G103 receiving subarray specifying signal BSCU and write activation signal WENC, N channel MOS transistors N101 and N100 that are made conductive when an output signal of NOR gate G103 is at the H level and transmit output signals of tristate inverters TIV1 and TIV2 to local data lines DCU and DU, respectively, an NOR gate G104 receiving a complemental write activation signal WENC and subarray specifying signal BSCL, and N channel MOS transistors N103 and N102 transmitting output signals of tristate inverters TIV1 and TIV2 to local data lines DCL and DL, respectively, when an output signal of NOR gate G104 is at the H level.

Subarray specifying signals BSCU and BSCL specify subarrays MAU and MAL, respectively, when activated (at the L level). Therefore, when complemental write activation signal WENC is activated to the L level in data writing, an output signal of one of NOR gates G103 and G104 provided for the selected subarray is set to the H level, corresponding N channel MOS transistors N101, N100 or N103, N102 are made conductive, and output signals of tristate inverters TIV1 and TIV2 are transmitted to local data lines DCU, DU or DCL, DL for the selected subarray.

When the corresponding subarray is not selected, subarray specifying signal BSCU or BSCL is at the H level, an output signal of one of NOR gates G103 and G104 for a non-selected subarray is set to the L level, to inhibit transmission of write data of the local data lines for the non-selected subarray.

By forming local data lines DU, DCU and DL, DCL into the division structure corresponding to the respective subarrays and connecting only the local data lines for the selected subarray to sense amplifier SA or write driver WDR using isolation gates P100-P103 and N100-N103, loads of local data lines DU, DCU and DL, DCL are reduced. Therefore, in data reading, selected memory cell data can be transmitted at a high speed to the latch type sense amplifier SA to perform a sense operation to read data.

It is to be noted that, in a standby state of the construction shown in FIG. 5, tristate inverters TIV1 and TIV2 are set to the output high impedance state, and all of MOS transistors N100-N103 are set to the OFF state. In this arrangement, a precharge circuit may be provided at outputs of tristate inverters TIV1 and TIV2 for precharging to a predetermined voltage level such as the power supply voltage during standby, and such a construction may be employed, in which MOS transistors N100-N103 are made conductive during standby.

Figure 6:
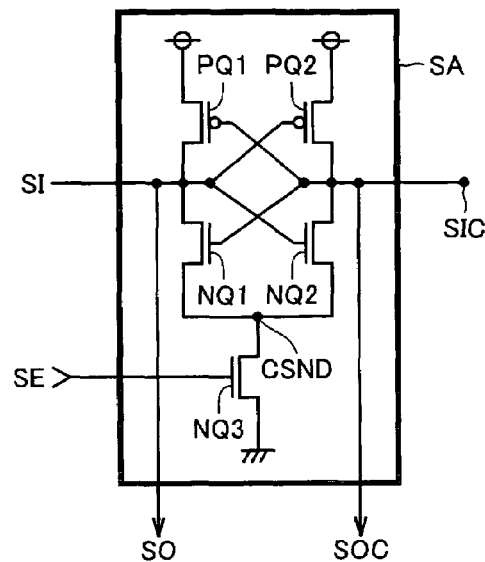
FIG. 6 shows an example of a construction of a sense amplifier shown in FIG. 5.

FIG. 6 shows an example of a construction of sense amplifier SA shown in FIG. 5. In FIG. 6, sense amplifier SA includes a P channel MOS transistor PQ1 connected between the power supply node and sense node SI and having the gate connected to sense node SIC, a P channel MOS transistor PQ2 connected between the power supply node and sense node SIC and having the gate connected to sense node SI, an N channel MOS transistor NQ1 connected between sense node SI and a common source node CSND and having the gate connected to sense node SIC, an N channel MOS transistor NQ2 connected between sense node SIC and common source node CSND and having the gate connected to sense node SI, and an N channel MOS transistor NQ3 coupling common source node CSND to the ground node supplying the ground potential when sense activation signal SE is activated.

Sense amplifier SA shown in FIG. 6 is a latch type sense amplifier, that is, a cross-coupled sense amplifier which forms an inverter latch with MOS transistors PQ1, PQ2, NQ1, and NQ2 when activated. When sense activation signal SE is in an inactive state of the L level, sense nodes SI and SIC are at the precharge voltage level or at levels of the read data signals. In this state, common source node CSND is at the high level (a level close to the precharge voltage).

When sense activation signal SE is set to the H level, MOS transistor NQ3 is set to the ON state and common source node CSND is set to the ground potential level. Sense nodes SI and SIC are at a voltage level close to the precharge voltage level, and one of sense nodes SI and SIC at a lower potential is discharged to the ground potential level by MOS transistor NQ1 or NQ2, while the other of sense nodes SI and SIC at a higher potential is driven to the power supply voltage level (a voltage level of the power supply node) by MOS transistor PQ1 or PQ2, and then a signal potential difference between these sense nodes SI and SIC is differentially amplified to generate complementary signals SO and SOC.

Only a sense activation transistor for driving sense nodes SI and SIC to the ground potential level is provided in this cross-coupled sense amplifier because sense nodes SI and SIC are set to the precharge voltage level of the power supply voltage level.

By utilizing cross-coupled sense amplifier SA as shown in FIG. 6, a small potential difference can be amplified at a high speed to generate a signal of a CMOS level (a signal changing between the power supply voltage and the ground voltage) to generate complementary signals SO and SOC.

Figure 7:
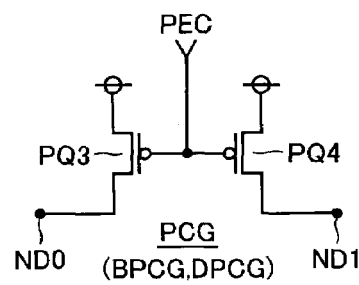
FIG. 7 shows an example of a construction of a bit line precharge circuit and a data line precharge circuit shown in FIG. 5.

FIG. 7 shows an example of a construction of precharge circuits BPCG and DPCG shown in FIG. 5, which precharge the bit line and the local data line, respectively. Since precharge circuits BPCG and DPCG precharging the bit line and the local data line respectively have the same construction, a precharge circuit PCG is shown in FIG. 7 as a representative of these precharge circuits. Precharge circuit PCG includes P channel MOS transistors PQ3 and PQ4 which transmit the power supply potential to respective nodes ND0 and ND1 in response to activation of a precharge activation signal PEC. Nodes ND0 and ND1 are connected to complementary bit lines or complementary local data lines, respectively.

Precharge activation signal PEC is at the L level when activated, and nodes ND0 and ND1 are precharged to a level of a voltage of the power supply node (the power supply voltage). When precharge activation signal PEC is in a deactivated state, MOS transistors PQ3 and PQ4 are made non-conductive and nodes ND0 and ND1 are isolated from the power supply node. Activation/deactivation of precharge activation signal PEC is controlled every memory block, and a precharge operation is stopped in a selected memory block to perform writing or reading of data. A non-selected memory block maintains a precharge state.

Figure 8:
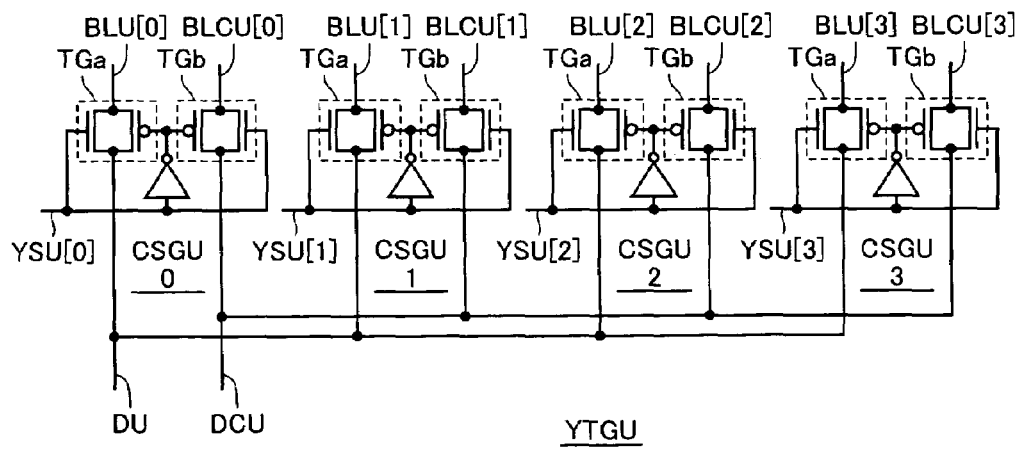
FIG. 8 shows an example of a construction of a column selection circuit shown in FIG. 5.

FIG. 8 shows an example of a construction of column selection circuits YTGU and YTGL shown in FIG. 5. The only difference between column selection circuits YTGU and YTGL is column selection signals applied thereto, and thus a construction of column selection circuit YTGU together with corresponding bit lines and the column selection signal are representatively shown in FIG. 8.

In FIG. 8, column selection circuit YTGU includes column selection gates CSGU0-CSGU3 provided for bit line pairs BLU[0], BLCU[0]-BLU[3], BLCU[3], respectively. Each of column selection gates CSGU0-CSGU3 includes a CMOS transmission gate TGa provided for each of bit lines BLU[0]-BLU[3] and a CMOS transmission gate TGb provided for each of bit lines BLCU[0]-BLCU[3].

Column selection gates CSGU0-CSGU3 have corresponding CMOS transmission gates TGa and TGb made conductive in response to column selection signals YSU[0]-YSU[3], respectively, and couple corresponding bit lines BLU[0], BLCU[0]-BLU[3], BLCU[3] to data lines DU and DCU when made conductive.

One of column selection signals YSU[0]-YSU[3] is driven into a selected state when subarray MAU is selected, and one bit line pair is coupled to local data lines DU and DCU. Column selection circuit YTGL provided for subarray MAL has a similar construction and includes CMOS transmission gates TGa and TGb provided for respective bit lines BLL[0], BLCL[0]-BLL[3], BLCL[3], and couples a selected bit line pair to local data lines DL and DCL according to column selection signals YSL[0]-YSL[3].

As shown in FIG. 8, capacitances of CMOS transmission gates TGa and TGb provided for respective bit lines are connected to local data lines DU and DCU, respectively and a load of each of local data lines DU and DCU is a sum of a load of a selected bit line pair and parasitic capacitances of non-selected column selection gates. By forming the local data line into a divided data line structure and coupling the local data line of the selected subarray to the sense node, parasitic capacitances of one column selection circuit and the selected bit lines are only connected to the respective sense nodes, resulting in reduced parasitic capacitance of the sense nodes of the sense amplifier.

Figure 9:
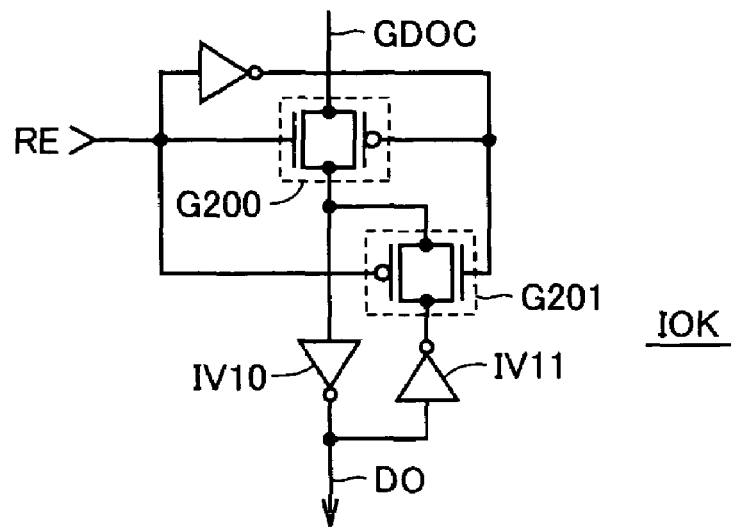
FIG. 9 shows a construction of an output circuit of one bit of an input/output circuit shown in FIG. 4.

FIG. 9 schematically shows an example of a construction of a data output circuit included in input/output circuit IOK of one bit shown in FIG. 4. In FIG. 9, the data output circuit of one bit input/output circuit IOK includes a CMOS transmission gate G200 for transmitting a signal on global read data line GDOC when read enable signal RE is activated, an inverter IV10 inverting an output signal of CMOS transmission gate G200 to generate external read data DO, an inverter IV11 inverting external read data DO, and a CMOS transmission gate G201 which is made conductive when read enable signal RE is deactivated (at the L level) and transmits an output signal of inverter IV11 to an input of inverter IV10 when made conductive. CMOS transmission gates G200 and G201 are made conductive complementarily to each other.

In data reading, read enable signal RE is activated, and read data transmitted via global read data line GDOC is transmitted to inverter IVI0 via CMOS transmission gate G200 to generate external read data (1 bit) DO. In this situation, CMOS transmission gate G201 is in the OFF state. When data reading is completed and read enable signal RE is set to the L level, CMOS transmission gate G200 is set to the OFF state while CMOS transmission gate G201 is set to the ON state, and a latch circuit is formed with inverters IV10 and IV11 to maintain external data DO. An external processor or the like samples external read data (1 bit) DO at an appropriate timing.

The output circuit shown in FIG. 9 is arranged correspondingly to each IO block in input/output circuit IOCK and operates concurrently according to read enable signal RE, and thereby multi-bit data DO is output.

Figure 10:
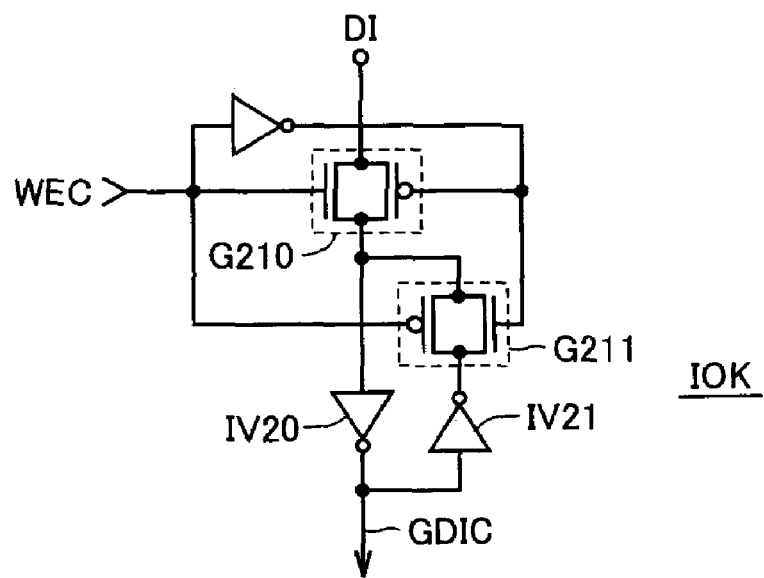
FIG. 10 shows an example of a construction of an input circuit of one bit of the input/output circuit shown in FIG. 4.

FIG. 10 schematically shows an example of a construction of a data input circuit included in input/output circuit IOK of one bit shown in FIG. 4. In FIG. 10, the data input circuit of one bit input/output circuit IOK includes a CMOS transmission gate G210 which is made conductive when a write designation signal WEC is deactivated and transfers external input data DI when made conductive, an inverter IV20 inverting data from CMOS transmission gate G210 and transferring the inverted signal to global write data line GDIC, an inverter IV21 inverting an output signal of inverter IV20, and a CMOS transmission gate G211 which is made conductive when write designation signal WEC is activated and transfers an output signal of inverter IV21 to an input of inverter IV20 when made conductive.

External input data (1 bit) DI is applied at a similar timing as the address signal but at a faster timing than an edge of clock signal CLK, and is set to a definite state. When external input data (1 bit) DI is set to the definite state, clock signal CLK and write designation signal WEC are activated and CMOS transmission gate G210 is set to the OFF state, while CMOS transmission gate G211 is set to the ON state and input data DI is latched with inverters IV20 and IV21. Data writing to the selected memory cell is performed internally based on the latched data by the write driver provided for the selected memory block.

The input circuit shown in FIG. 10 is arranged correspondingly to each IO block in input/output circuit IOCK, and each bit of multi-bit data externally applied is transferred concurrently from the corresponding input circuit to the corresponding global write data line.

Figure 11:
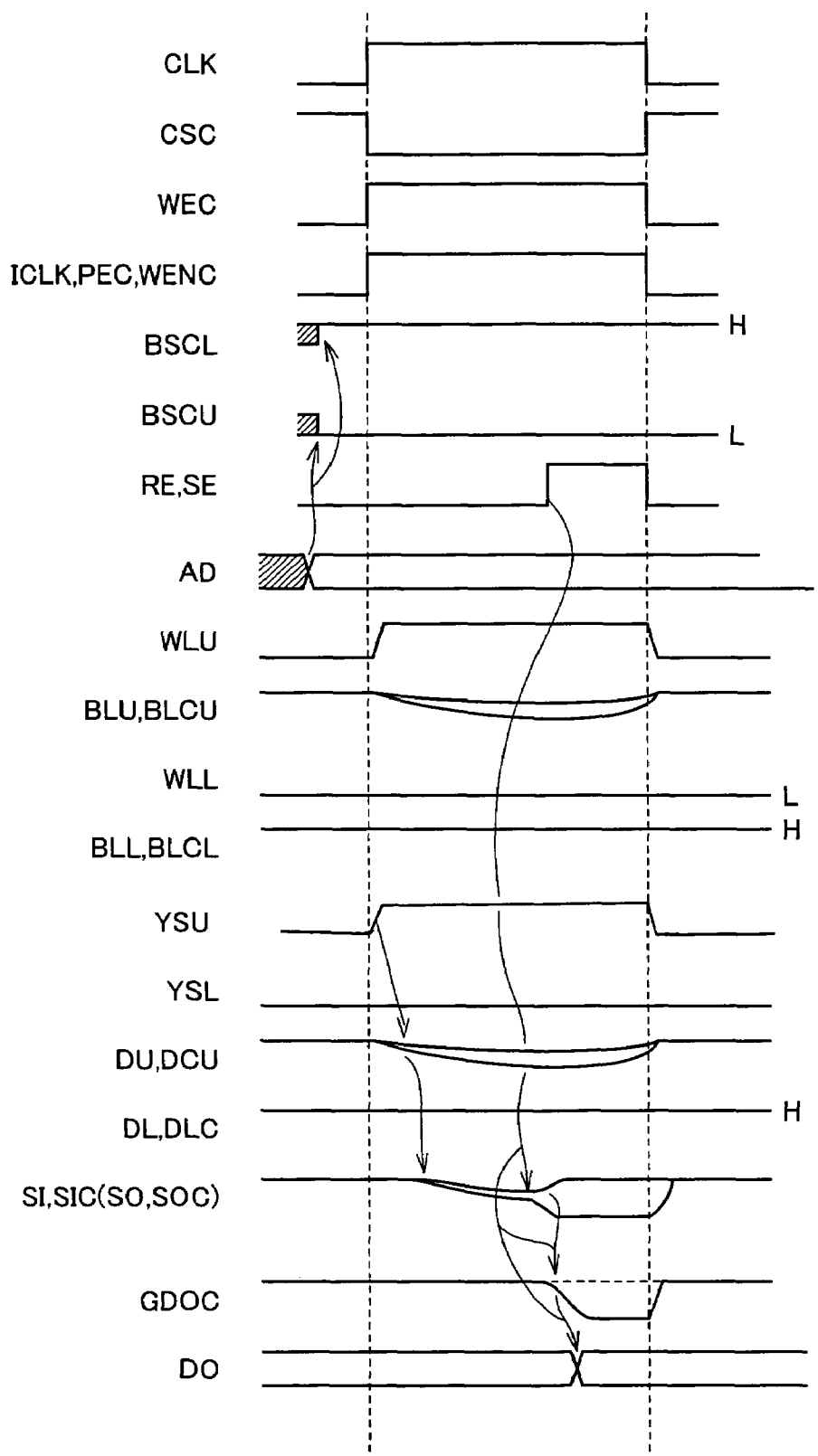
FIG. 11 is a signal waveform diagram representing an operation in data reading of the semiconductor memory device shown in FIGS. 4 and 5.

FIG. 11 is a signal waveform diagram representing an operation in data reading of the semiconductor memory device according to the first embodiment of the present invention. The operation of the semiconductor memory device shown in FIGS. 4 and 5 will now be described, referring to FIG. 11. FIG. 11 shows signal waveforms shown as an example in the case when subarray MAU shown in FIG. 5 is selected and a word line WLU of subarray MAU is selected to read memory cell data.

The semiconductor memory device operates when clock signal CLK is at the H level, and is set to a non-operating state when clock signal CLK is at the L level.

When clock signal CLK is at the L level, control circuit CTL shown in FIG. 4 maintains both of internal clock signal ICLK and read enable signal RE at the L level. Therefore, row decode circuit XD shown in FIG. 4 is in an inactive state and all of word lines WLs in memory blocks MB[0]-MB[3] shown in FIG. 4 are in a non-selected state.

On the other hand, precharge designation signal PEC is in an active state of the L level, and all of bit lines BLU, BLCU and BLL, BLCL in memory blocks MB[0]-MB[3] are precharged to the H level of the power supply voltage level. Similarly, local data lines DU and DCU shown in FIG. 5 are precharged to the power supply voltage level with corresponding precharge circuit DPCG, and local data lines DL and DCL are also precharged to the power supply voltage level with corresponding precharge circuit DPCG.

A block selection signal is generated asynchronously to clock signal CLK (a construction thereof will be described below). Now, according to the block selection signal and the word line selection signal, subarray specifying signal BSCL is set to a non-selected state of the H level and subarray specifying signal BSCU is maintained in a selected state of the L level (because subarray MAU is selected). In this state, sense activation signal SE is in an inactive state of the L level and output signal SEC of inverter G100 shown in FIG. 5 is at the H level, and NAND gates G102 and G101 operate as inverters. Therefore, in this state, an output signal of NAND gate G101 is set to the H level and P channel MOS transistors P102 and P103 are set to the OFF state. On the other hand, an output signal of NAND gate G102 is at the L level, P channel MOS transistors P100 and P101 are in the ON state, and sense nodes SI and SIC of sense amplifier SA are precharged to the power supply voltage level by data line precharge circuit DPCG provided on local data lines DU and DCU.

In addition, since complemental sense activation signal SEC is at the H level, read driver RDR has both MOS transistors P110 and N110 kept in the OFF state and is in the output high impedance state.

Write driver WDR has tristate inverters TIV1 and TIV2 held in the output high impedance state because write activation signal WEN is in an inactive state. In addition, complemental write activation signal WENC is at the H level, output signals of NOR gates G103 and G104 are at the L level, and all of isolation gate transistors N100-N103 for data writing are in the OFF state.

When clock signal CLK rises to the H level, an access designation signal CSC from an outside of the memory device is set to the L level and write signal WEC is set to the H level, a data read mode is specified.

Control circuit CTL shown in FIG. 4 drives both internal clock signal ICLK and precharge designation signal PEC to the H level according to states of control signals CSC and WEC at a rise of clock signal CLK. Precharge designation signal PEC is deactivated only for a selected memory block, and precharge designation signal PEC is maintained at the L level for the other non-selected memory blocks.

When internal clock signal ICLK is set to the H level in synchronization with rising of clock signal CLK, row decode circuit XD performs a decode operation according to address signal AD. In this step, local control circuit LC activates row decode circuit XD for selected subarray MAU according to subarray specifying signal BSCU. Row decode circuit XD for non-selected subarray MAL is maintained in the non-selected state. Therefore, word line WLL in subarray MAL is maintained in the non-selected state of the L level, while in subarray MAU, word line WLU corresponding to a row specified by address signal AD is driven to the selected state. Precharge operations for the bit lines are completed, and potential changes corresponding to stored data of the memory cell are generated on bit lines BLU, BLCU. Although precharge operations are completed in subarray MAL, word line WLL is in the non-selected state and bit lines BLL and BLCL maintain the precharge voltage level.

A column selection operation is performed concurrently with or slightly earlier than a word line selection operation. In this step, one of column selection signals YSU[0]-YSU[3] (YSU) for column selection circuit YTGU shown in FIG. 5 is driven into the selected state according to subarray specifying signal BSCU for the selected subarray. Column selection signals YSL[0]-YSL[3] for column selection circuit YTGL maintain the L level of the non-selected state. Therefore, local data lines DL and DCL are isolated from the bit lines of subarray MAL, and maintain the precharge voltage level.

Through the column selection operation of column selection circuit YTGU shown in FIG. 5, bit line pair BLU and BLCU for the selected column is connected to local data lines DU and DCU, and voltage levels of local data lines DU and DCU change from the precharge voltage level to the voltage levels corresponding to stored data of the selected memory cell. The potential changes of local data lines DU and DCU are transmitted to sense nodes SI and SIC via MOS transistors P100 and P101, and potentials of sense nodes SI and SIC change. In this situation, sense nodes SI and SIC have small loads since only local data lines DU and DCU are coupled thereto as described above, and potentials of sense nodes SI and SIC change at a high speed.

When a potential difference of sense nodes SI and SIC is sufficiently increased, sense activation signal SE is activated and sense amplifier SA performs the sense operation. In response to the activation of sense activation signal SE, complementary sense activation signal SEC outputted from inverter G100 is set to the L level, an output signal of NAND gate G102 is set to the H level, and MOS transistors P100 and P101 are set to the OFF state. Therefore, sense amplifier SA performs the sense operation with sense nodes SI and SIC being isolated from local data lines DU and DCU. By performing the sense operation according to a so-called "charge confinement scheme", loads of sense nodes SI and SIC are reduced and the sense operation is performed at a high speed. Output signals SO and SOC of sense amplifier SA are driven to the power supply voltage level and the ground voltage level according to stored data of the selected memory cell.

When sense activation signal SE is activated, NOR gates G110 and G112 operate as inverters in read driver RDR and drive global read data line GDOC according to the amplified data from sense amplifier SA. Global read data line GDOC is driven to the precharge voltage level (H level) or the L level according to the read data.

Concurrently with the sense operation, read enable signal RE is activated, CMOS transmission gate G200 is made conductive in the data output circuit shown in FIG. 9, and external data DO is generated.

When clock signal CLK attains the L level, access designation signal (control signal) CSC attains the H level, write signal WEC attains the L level, and one operation cycle is completed. According to the fall of clock signal CLK and rise of the control signal CSC, internal clock signal ICLK from control circuit CTL is set to the L level and precharge designation signal PEC is also set to the L level. Correspondingly, read enable signal RE and sense activation signal SE are also set to the inactive state of the L level, subarray MAU in memory block MB returns to the precharge state, word line WLU is driven into the non-selected state, and each of bit lines BLU and BLCU returns to the precharge voltage level. In memory subarray MAL, bit lines BLL and BLCL are similarly precharged to the precharge voltage level by precharge circuit PCG.

Similarly, local data lines DU, DCU and DL, DCL are precharged to the power supply voltage level by corresponding precharge circuits PCG. Since sense amplifier SA is in the deactivated state, sense nodes SI and SIC are also precharged to predetermined voltage levels by the precharge voltage from local data lines DU and DCU, since MOS transistors P100 and P101 are in the ON state in this situation. Read driver RDR is again set to the output high impedance state, and global read data line GDOC returns to a predetermined precharge voltage level.

Therefore, in a time period of the H level of clock signal CLK, sense activation signal SE can be activated at a faster timing as compared with a construction in which data lines DU and DCU and local data lines DL and DCL extend continuously, since the loads of sense nodes SI and SIC are reduced in the present embodiment.

Figure 12:
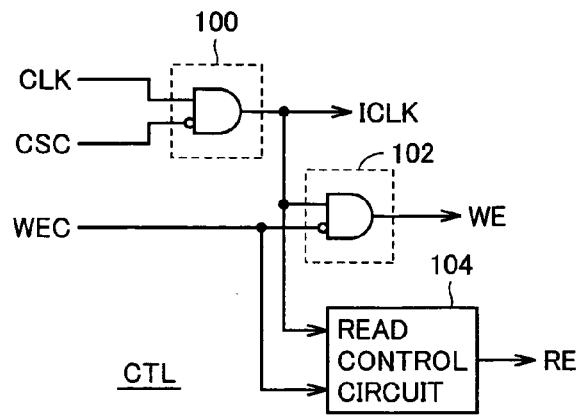
FIG. 12 schematically shows an example of a construction of a control circuit shown in FIG. 4.

FIG. 12 schematically shows an example of a construction of control circuit CTL shown in FIG. 10. In FIG. 12, control circuit CTL includes a clock gate 100 receiving clock signal CLK and access designation signal CSC from the outside of the device to generate internal clock signal ICLK, a write control gate 102 receiving internal clock signal ICLK and write designation signal WEC to generate a write enable signal (a write activation signal) WE, and a read control circuit 104 receiving internal clock signal ICLK and write designation signal WEC to generate read enable signal RE.

A clock control gate 100 sets internal clock signal ICLK to the H level when external clock signal CLK is at the H level and access designation signal CSC is at the L level. Therefore, when access designation is supplied, internal clock signal ICLK is generated while external clock signal CLK is at the H level, and the semiconductor memory device performs a designated operation.

Write control gate 102 activates write enable signal WE when internal clock signal ICLK is at the H level and write designation signal WEC is at the L level. Write driver WDR provided for the selected memory block is activated according to write enable signal WE.

Read control circuit 104 delays activation of at least one of internal clock signal ICLK and write designation signal WEC by a predetermined period of time, to activate read enable signal RE, and when internal clock signal ICLK and write designation signal WEC are deactivated, it deactivates read enable signal RE. Read control circuit 104 can be implemented with, for example, a circuit which delays a rise of write designation signal WEC by a predetermined period and takes AND of the rise delayed signal and internal clock signal ICLK.

Figure 13:
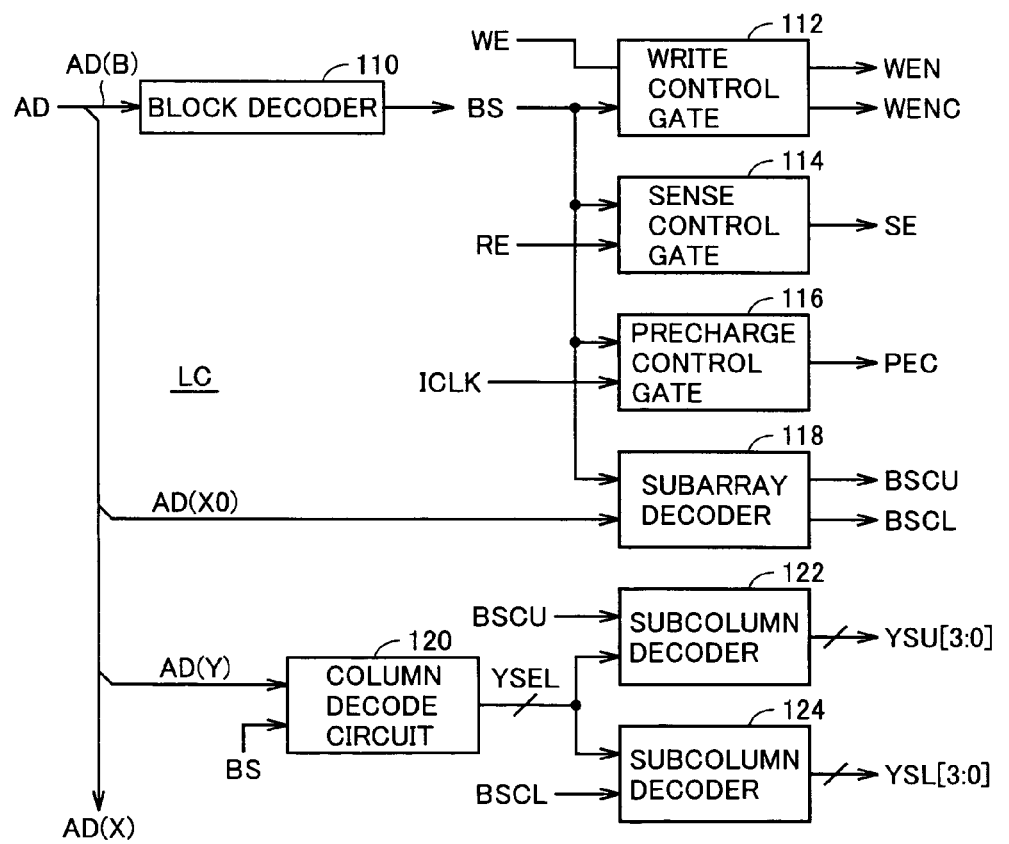
FIG. 13 schematically shows an example of a construction of a local control circuit shown in FIG. 4.

FIG. 13 schematically shows a construction of local control circuit LC shown in FIG. 10. In FIG. 13, local control circuit LC includes a block decoder 10 decoding a block address AD(B) included in address signal AD to generate a block selection signal BS, a write control gate 112 generating write activation signals WEN and WENC according to block selection signal BS from block decoder 110 and write enable signal WE, a sense control gate 114 generating sense activation signal SE according to block selection signal BS and read enable signal RE, a precharge control gate 116 generating precharge designation signal PEC according to block selection signal BS and internal clock signal ICLK, and a subarray decoder 118 generating subarray specifying signals BSCU and BSCL according to a prescribed bit AD (X0) of a word line address included in address signal AD and block selection signal BS. Prescribed word line address bit AD (X0) is, for example, a most significant bit of the word line address.

Block decoder 110 decodes the block address included in address signal AD asynchronously to the clock signal and generates block selection signal BS.

Write control gate 112 is enabled when block selection signal BS specifies corresponding memory block MB and generates complementary write activation signals WEN and WENC according to write enable signal WE.

Sense control gate 114 activates sense activation signal SE according to read enable signal RE when block selection signal BS specifies the corresponding memory block. Therefore, in the non-selected memory block, sense activation signal SE is in the inactive state even when read enable signal RE is activated.

When block selection signal BS specifies the corresponding memory block, precharge control gate 116 sets precharge designation signal PEC to the H level and stops the precharge operation in the selected memory block while internal clock signal ICLK is at the H level.

When block selection signal BS specifies the corresponding memory block, subarray decoder 118 determines which word line of two subarrays MAU and MAL is specified according to prescribed bit AD (X0) of the word line address, and selectively activates subarray specifying signals BSCU and BSCL.

Local control circuit LC further includes a column decode circuit 120 decoding a column address signal AD(Y) of address signal AD when block selection signal BS is activated, to generate a column selection signal YSEL, a sub column decoder 122 generating a column selection signal YSU[3:0] for subarray MAU according to subarray specifying signal BSCU and column selection signal YSEL, and a sub column decoder 124 generating a column selection signal YSL[3:0] for subarray MAL according to column selection signal YSEL and subarray specifying signal BSCL.

When block selection signal BS specifies the corresponding memory block, column decode circuit 120 decodes column address AD(Y) and generates column selection signal YSEL. Column selection signal YSEL specifies the same column for both of two subarrays MEU and MEL in the corresponding memory block. One of sub column decoders 122 and 124 is enabled by subarray specifying signals BSCU and BSCL, to generate column selection signal YSU[3:0] or YSL[3:0] for the selected subarray.

Therefore, in the non-selected memory block, column decode circuit 120 is in the inactive state and the column selection operation is not performed.

Prescribed word line address bit AD (X0) included in address signal AD is also applied to row decode circuit XD shown in FIG. 4. Row decode circuit XD performs the decode operation according to internal clock signal ICLK and block selection signal BS. In this arrangement, when addresses of the word lines in subarrays MAU and MAL are set every memory block, the word line is selected in the selected subarray because word lines of subarrays MAU and MAL have different address regions. On the contrary, when the word line addresses are allotted with the same address region for subarrays MAL and MAU and word line address AD(X0) is utilized as a subarray specifying address, the row decode circuit for subarrays MAU and MAL is activated according to subarray specifying signals BSCU and BSCL.

It is to be noted that, in the construction shown in FIG. 13, precharge control gate 116 generates precharge designation signal PEC according to block selection signal BS and internal clock signal ICLK. In this arrangement, activation/deactivation of the precharge operation is controlled for each memory block. When subarray specifying signals BSCU and BSCL are applied to precharge control gate 116 in place of block selection signal BS, a construction can be implemented which maintains the precharge operation for the non-selected subarray and the corresponding local data-line and stops the precharge operation only for the selected subarray.

As described above, in the construction according to the first embodiment of the present invention, each memory block is divided into two subarrays, the local data bus is provided for each subarray, and the local data bus of the selected subarray is connected to the sense amplifier. Thus, the load of each sense node of the sense amplifier is reduced, the potentials of the sense nodes can be changed at a high speed, and high-speed reading can be implemented. In particular, with the local data line division structure in which the local data line is arranged corresponding to each subarray, an effect of the bit line division structure can be fully exhibited, the local data line load can be reduced, and the sense operation can be performed at a high speed.

In addition, by utilizing a block division structure in which the memory array in each IO block is divided into a plurality of blocks, and dividing each memory block into subarrays, an increase in bit line load can be suppressed even when a storage capacity is increased, and high-speed access can be implemented.

Second Embodiment

Figure 14:
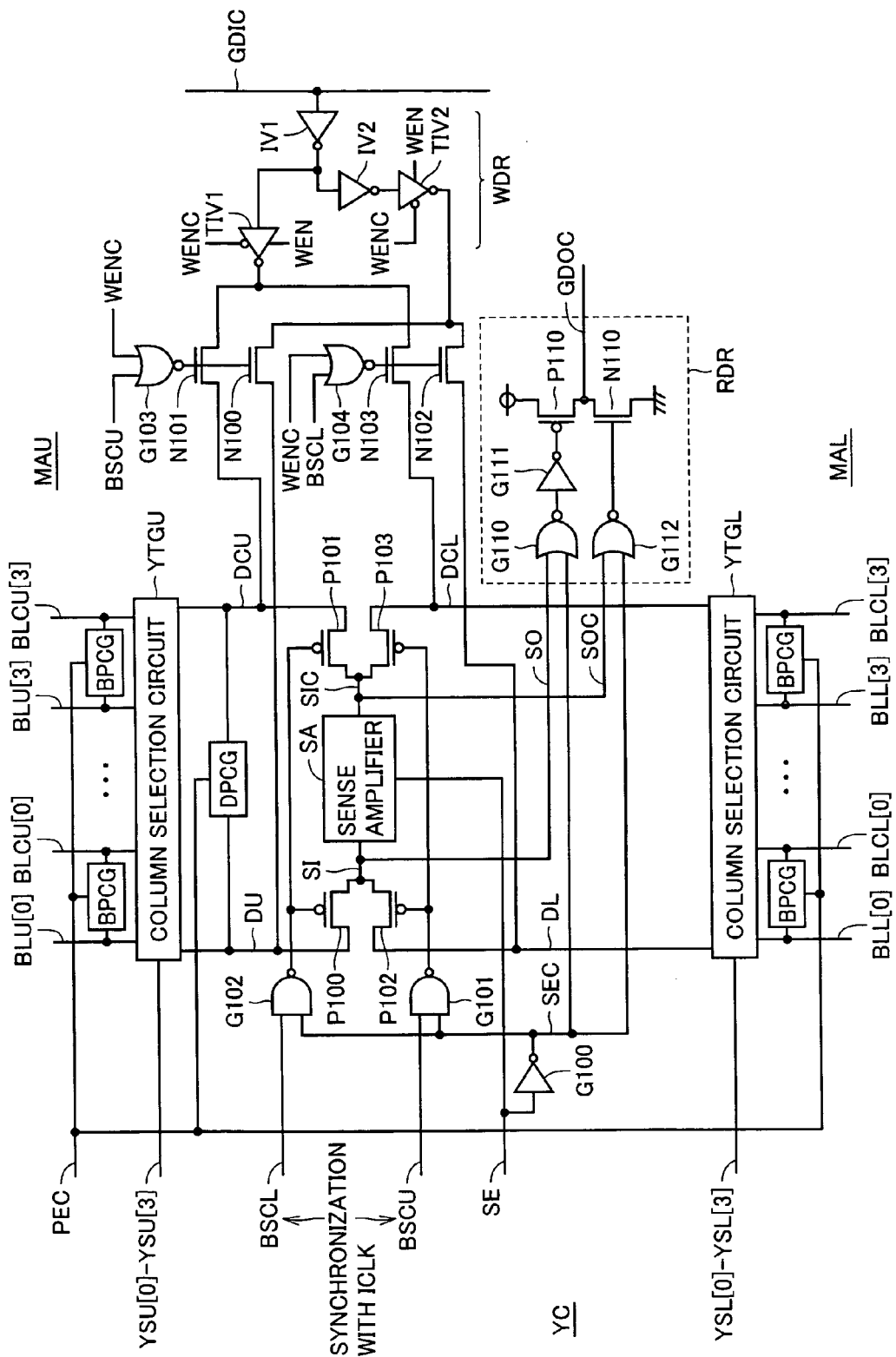
FIG. 14 shows a construction of a column circuit of a semiconductor memory device according to a second embodiment of the present invention.

FIG. 14 schematically shows a construction of column circuit YC of a semiconductor memory device according to a second embodiment of the present invention. Column circuit YC shown in FIG. 14 is different in construction from column circuit YC shown in FIG. 5 in the following points. Specifically, data line precharge circuit DPCG is provided for local data lines DU and DCU. The data line precharge circuit is not arranged for local data lines DL and DCL for subarray MAL.

In addition, subarray specifying signals BSCL and BSCU are generated in synchronization with internal clock signal ICLK. The other portions of the construction of column circuit YC shown in FIG. 14 are the same as those of column circuit YC shown in FIG. 5, and corresponding portions are indicated with the same reference characters and detailed descriptions thereof will not be repeated.

Figure 15:
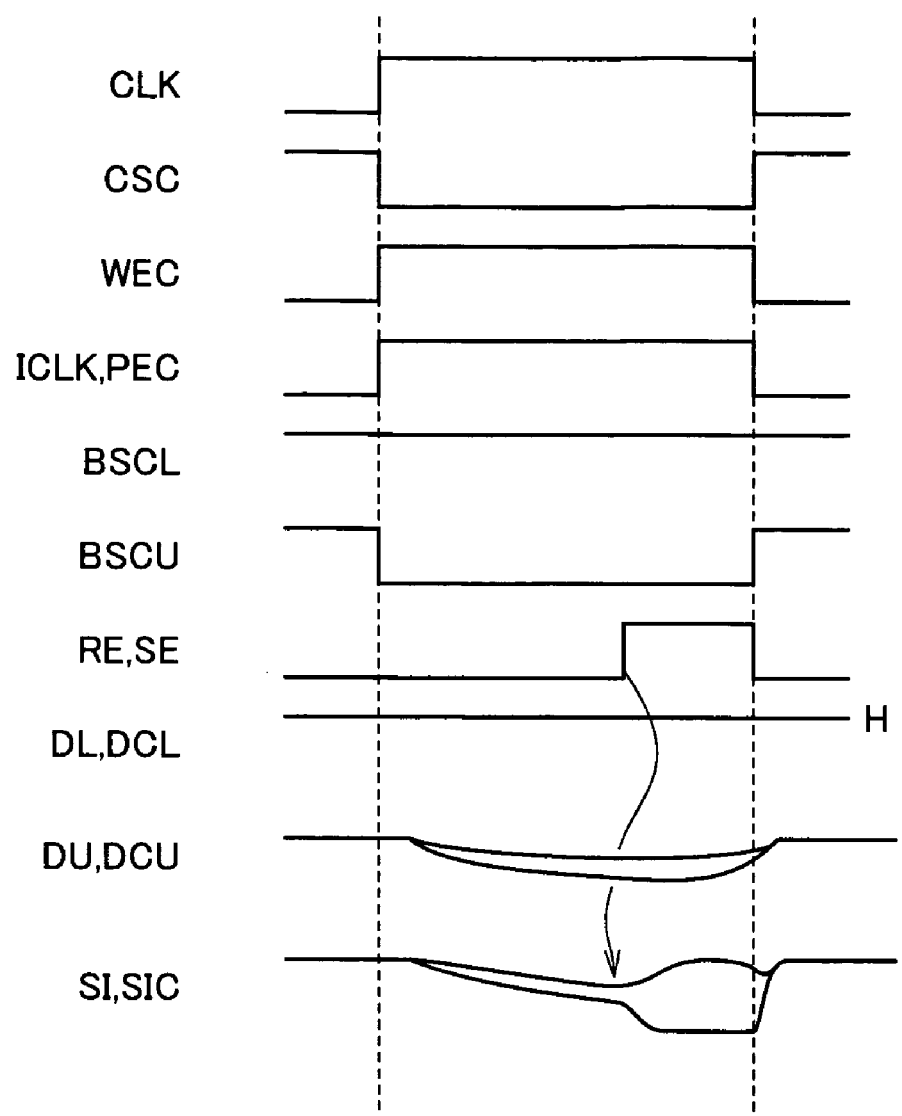
FIG. 15 is a signal waveform diagram representing an operation of the column circuit shown in FIG. 14.

FIG. 15 is a signal waveform diagram representing an operation in data reading of column circuit YC shown in FIG. 14. The operation in data reading of column circuit YC shown in FIG. 14 will now be described referring to FIG. 15.

When external clock signal CLK is at the L level, the semiconductor memory device is in the non-operating state, precharge designation signal PEC is in an active state of the L level, and subarray specifying signals BSCL and BSCU are both at the H level. In addition, sense activation signal SE is at the L level and complementary sense activation signal SEC is at the H level. Accordingly, output signals of NAND gates G102 and G101 are at the L level, all of MOS transistors P100-P103 are in the ON state, and sense nodes SI and SIC are coupled to local data lines DU and DCU and to local data lines DL and DCL. Since precharge designation signal PEC is in the active state, data line precharge circuit DPCG is activated and local data lines DU and DCU are precharged to the H level. The precharge voltage of data line precharge circuit DPCG is also transmitted to local data lines DL and DCL via MOS transistors P100-P103, and local data lines DL and DCL are also precharged to the power supply voltage level.

A data read operation is started when clock signal CLK is set to the H level and externally applied control signals CSC and WEC instructing an operation mode are set to the L level and the H level, respectively. In synchronization with clock signal CLK, internal clock signal ICLK is set to the H level, precharge designation signal PEC is set to the H level, data line precharge circuit DPCG and bit line precharge circuit BPCG are deactivated, and the precharge operation of this memory block stops. Subarray specifying signal BSCU is set to the active state of the L level while subarray specifying signal BSCL is at the H level. Since sense activation signal SE is still at the L level, an output signal of NAND gate G102 is at the L level while an output signal of NAND gate G101 is set to the H level, and MOS transistors P100 and P101 are set to the ON state while MOS transistors P102 and P103 are set to the OFF state. Accordingly, local data buses DL and DCL are isolated from sense nodes SI and SIC, and local data lines DU and DCU are continuously connected to sense nodes SI and SIC.

The column selection operation is performed, and potentials on the bit lines of the selected column are transmitted via column selection circuit YTGU and local data lines DU and DCU to sense nodes SI and SIC.

When sense activation signal SE is activated, the output signal of NAND gate G102 attains the H level, MOS transistors P100 and P10 are set to the OFF state, and local data lines DU and DCU are isolated from sense amplifier SA. Sense amplifier SA differentially amplifies the potentials of sense nodes SI and SIC according to activation of sense activation signal SE, to generate sense output signals SO and SOC.

When external clock signal CLK is set to the L level, an operation period of the semiconductor memory device is ended, precharge designation signal PEC is again activated to the L level to cause subarrays MAU and MAL to return to the precharge state (drive the selected word line into the non-selected state), and each bit line is precharged by bit line precharge circuit BPCG, while data lines DU and DCU are precharged by data line precharge circuit DPCG. In this step, local data lines DU and DCU are coupled to local data lines DL and DCL, and local data lines DL and DCL which have been in a floating state are again precharged to a predetermined potential.

In the construction of column circuit YC shown in FIG. 14, data line precharge circuit DPCG is provided for local data lines DU and DCU, while the precharge circuit is not provided for local data lines DL and DCL. Therefore, an occupation area of the circuit can be reduced. Particularly, when a large number of memory blocks are provided, the reduced occupation area of column circuit YC results in a significant reduction in an occupation area of a whole memory array. By generating subarray specifying signals BSCL and BSCU in synchronization with internal clock signal ICLK, even when the data line precharge circuit is not provided for local data lines DL and DCL, sense nodes SI and SIC can be reliably precharged to a prescribed precharge potential before a start of the operation cycle, and the other local data lines DL and DCL can also be precharged to the prescribed precharge potential.

It is to be noted that, the construction for generating subarray specifying signals BSCL and BSCU in synchronization with internal clock signal ICLK can be implemented by configuring block decoder 110 in local control circuit LC shown in FIG. 13 so as to start the decode operation in synchronization with internal clock signal ICLK. According to such configuration, block selection signal BS is generated in accordance with internal clock signal ICLK, and subarray specifying signals BSCU and BSCL can be generated in synchronization with internal clock signal ICLK.

Figure 16:
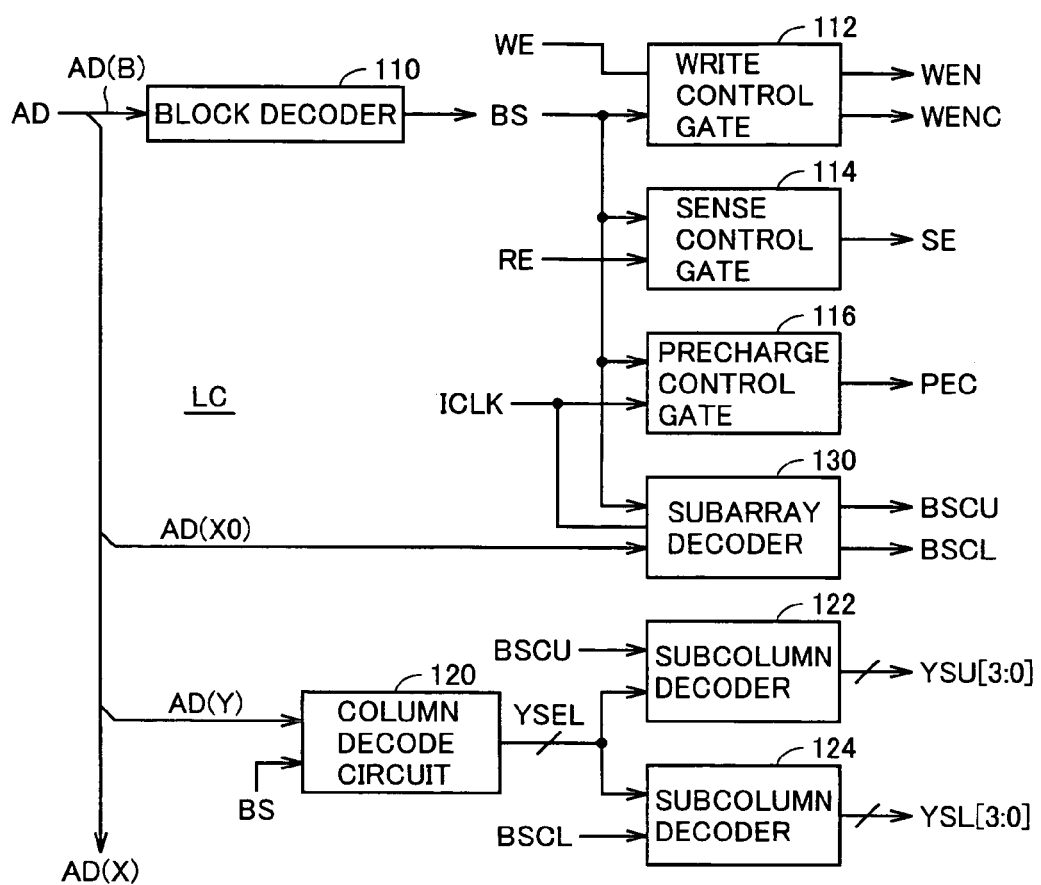
FIG. 16 shows an example of a construction of a local control circuit in the second embodiment of the present invention.

Alternatively, as shown in FIG. 16, internal clock signal ICLK may be provided to subarray decoder 130 to generate, in subarray decoder 130, subarray specifying signals BSCU and BSCL according to block selection signal BS generated asynchronously to clock signal ICLK and address bit AD (X0) such as a most significant bit of the word line address signal.

Any construction may be used to generate a signal for selecting a subarray in synchronization with the clock signal. The other portions of a construction of local control circuit LC shown in FIG. 16 are the same as those of local control circuit LC shown in FIG. 13, and corresponding portions are indicated with the same reference characters and detailed descriptions thereof will not be repeated.

As described above, according to the second embodiment of the present invention, the precharge circuit is provided only for one side of the local data lines arranged between subarrays in the local data line division structure, and therefore a circuit occupation area can be reduced.

It is to be noted that, the sense amplifier and the write driver are arranged in a region between the subarrays. In this arrangement, such a construction may be utilized, in which the sense amplifier and the write driver are arranged on an end portion of the subarray, and the local data lines extend to the region of the subarray end portion.

Third Embodiment

Figure 17:
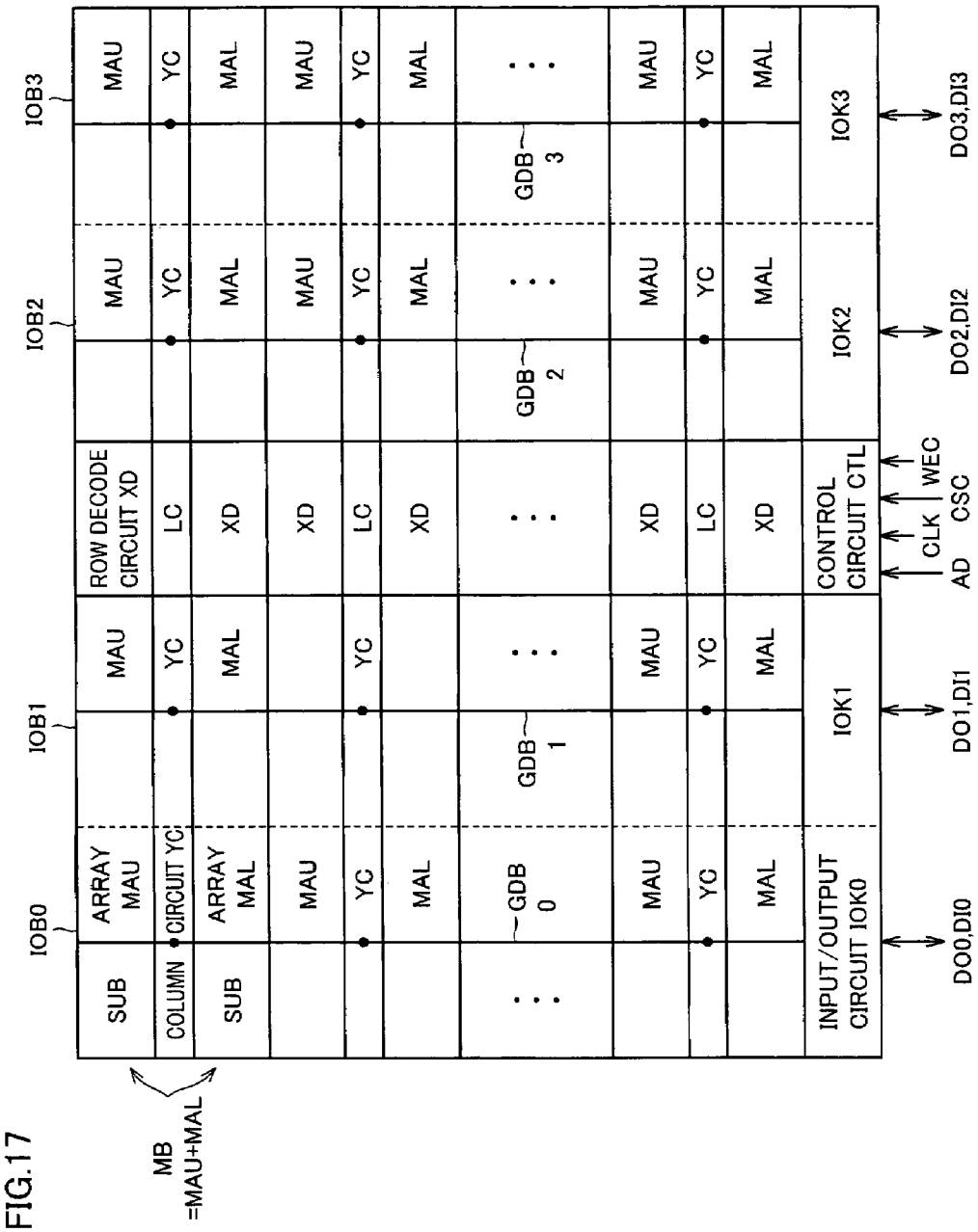
FIG. 17 schematically shows a layout of a whole construction of a semiconductor memory device according to a third embodiment of the present invention.

FIG. 17 schematically shows a construction of a main portion of a semiconductor memory device according to a third embodiment of the present invention. The semiconductor memory device in FIG. 17 inputs/outputs data of 4 bits, by way of example. Data bits DO0-DO3 indicate output data bits and data bits DI0-DI3 indicate input data bits. IO blocks IOB0-IOB3 are provided corresponding to respective inputs/output bits DO0, DI0-DO3, DI3. Data of 1 bit is input and output at each of IO blocks IOB0-IOB3.

Similarly as in the first and second embodiments, each of IO blocks IOB0-IOB3 is divided into a plurality of memory blocks MBs, and each memory block MB is divided into upper subarray MAU and lower subarray MAL. Column circuit YC is arranged between subarrays MAU and MAL of memory block MB. Column circuit YC includes a sense read circuit (the sense amplifier and the read driver), an internal write circuit (the write driver), an isolation/connection gate (the connection control circuit), and the column selection circuit, as in the first and second embodiments.

Global data bus GDB (GDB0-GDB3) is arranged in common to memory blocks MBs in each of IO blocks IOB0-IOB3. Global data buses GDB0-GDB3 each are coupled in common to the sense read circuits and the internal write circuits (the write drivers) in column circuits YC of corresponding IO blocks IOB0-IOB3. Global data buses GDB0-GDB3 each are arranged extending over memory blocks MBs (subarrays MBU and MBL) of corresponding IO blocks IOB0-IOB3. According to such bus arrangement, global data buses GDB0-GDB3 are not required to be arranged in dedicated interconnection regions in IO blocks IOB0-IOB3, and a layout area can be reduced.

In a region between IO blocks IOB1 and IOB2, row decode circuit XD is arranged corresponding to each of subarrays MAU and MAL of each memory block MB, and local control circuit LC is arranged corresponding to column circuit YC. Constructions of row decode circuit XD and local control circuit LC are the same as those shown in the first or second embodiment. When one row decode circuit XD out of row decode circuits XDs arranged in alignment is activated, a word line is selected in the subarray of a corresponding memory block, one column circuit YC is activated, and column selection is performed by the column selection circuit included in the selected and activated column circuit YC. Therefore, the memory cell in the same position is selected in each of IO blocks IOB0-IOB3, and data writing or reading for the selected memory cell is performed via corresponding global data buses GDB0-GDB3.

Input/output circuits IOK0-IOK3 are provided corresponding to respective IO blocks IOB0-IOB3, and input/output circuits IOK0-IOK3 respectively transfer data between corresponding global data buses GDB0-GDB3 and an external device.

In addition, control circuit CTL is provided in alignment with row decode circuit XD and local control circuit LC, and clock signal CLK, write enable signal WEC and chip select signal (access designation signal) CSC are provided to control circuit CTL. Address signal AD is transmitted to local control circuit LC and row decode circuit XD via a region arranging this control circuit CTL.

Therefore, as shown in FIG. 17, a data transfer between the semiconductor memory device and the external device is always performed via one end side (a lower side of FIG. 17). Thus, a system LSI such as a system on chip (SOC) can be implemented with 1 chip merely by arranging an interface circuit of data/signals on one side of the semiconductor memory device, and a circuit portion interfacing to a logic circuit on the same chip can be arranged readily adjacent and facing to the logic circuit, which mitigates a limitation of an arrangement position of the semiconductor memory device in the system on chip.

Figure 18:
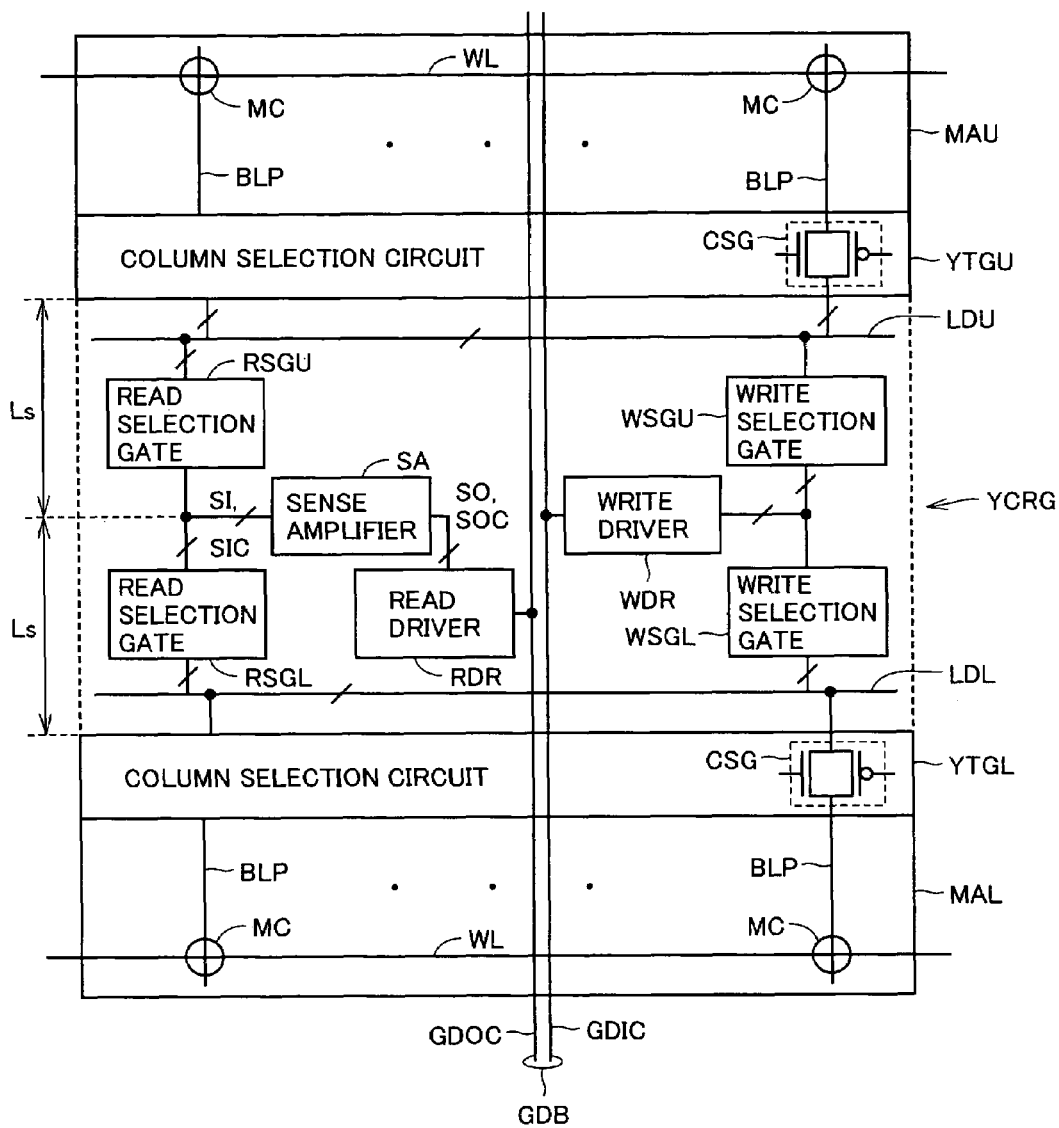
FIG. 18 schematically shows an arrangement of one memory block and a column circuit of the semiconductor memory device shown in FIG. 17.

FIG. 18 schematically shows an arrangement of one memory block and the column circuit of the semiconductor memory device shown in FIG. 17. In FIG. 18, a column circuit arrangement region YCRG is provided in alignment with subarrays MAU and MAL. Column selection circuits YTGU and YTGL arranged respectively for subarrays MAU and MAL, the sense read circuit (the sense amplifier and the read driver) for reading internal data, and the write driver (the internal write circuit) for writing internal data are arranged in column circuit arrangement region YCRG.

Bit line pair BLP and word line WL are arranged in each of subarrays MAU and MAL, and memory cell MC is arranged corresponding to a crossing of word line WL and bit line pair BLP.

In column circuit arrangement region YCRG, internal data lines LDU and LDL are arranged corresponding to respective column selection circuits YTGU and YTGL. Internal data lines LDU and LDL each are bus lines for transmitting complementary signals. In FIG. 18, the data line pair transmitting the complementary signals is indicated with a signal line having an inclined cross line.

Internal data line LDU is coupled to sense amplifier SA via a read selection gate RSGU, and internal data line LDL is coupled to sense amplifier SA via a read selection gate RSGL. Read selection gates RSGU and RSGL correspond to a portion of isolation gates IGU and IGL in the first embodiment and to the construction of transfer gates P100-P103 in the second embodiment. Sense amplifier SA has a construction of a cross-coupled latch type sense amplifier including cross-coupled P channel MOS transistors and cross-coupled N channel MOS transistors, similarly to the construction shown in FIG. 6.

Output signals SO, SOC of sense amplifier SA are transmitted to read driver RDR. An output of read driver RDR is coupled to global read data line GDOC included in global data bus GDB. Read driver RDR has a construction similar to that as shown in FIG. 5, and further amplifies complementary amplified data (SO, SOC) generated by sense amplifier SA to drive global read data line GDOC of a single end, when activated.

Internal data lines LDU and LDL are also coupled to write driver WDR through the respective write selection gates WSGU and WSGL. Write driver WDR generates internal write data according to internal write data on global write data line GDIC included in global data bus GDB. The constructions of write driver WDR and write selection gates WSGU and WSGL are similar to those shown in FIG. 5, for example. In the correspondence to the constructions shown in FIG. 5, write selection gates WSGU and WSGL correspond to a portion of transfer gates N100-N103, and write driver WDR has a similar construction as write driver WDR.

In the construction shown in FIG. 18, sense amplifier SA is arranged in a mid position of column circuit arrangement region YCRG with respect to a bit line extending direction, and a distance Ls from sense amplifier SA to each of column selection circuits YTGU and YTGL of subarrays MAU and MAL is made equal. Thus, a load of a read data transfer path becomes identical for selection of any of subarrays MAU and MAL, and the sense operation can be performed in sense amplifier SA at the same activation timing with the same margin to implement reliable and accurate data reading. In addition, a margin of the activation timing of sense amplifier SA can be decreased, the sense operation can be performed at a faster timing, and a data read time can be decreased.

A plurality of bit line pairs BLPs are arranged in each of subarrays MAU and MAL. Therefore, sense amplifier SA is arranged preferentially in an optimum position in column circuit arrangement region YCRG, and the other circuit components of the column circuit such as read driver RDR and write driver WDR excluding the column selection circuit are arranged in a remaining region. Write driver WDR is preferably arranged in a central position in the bit line extending direction in column circuit arrangement region YCRG. Write driver WDR, however, is formed with a buffer circuit (a tristate inverter buffer) having a large current driving capability as shown in FIG. 5, and therefore a small difference in loads of data transmission paths can be absorbed with the current driving capability of the write drivers, and internal write data can be transmitted to bit line pair BLP of a selected column at a high speed without causing a significant propagation delay.

In addition, since global data buses GDOC and GDIC are arranged extending over subarrays MAU, MAL and column circuit arrangement region YCRG, a layout area outside column circuit arrangement region YCRG for arranging global data bus GDB is not required, and therefore an array layout area on the chip can be reduced.

Furthermore, as shown in FIG. 5, read driver RDR is kept in the output high impedance state when not selected (sense activation signal SE includes a component of the block selection signal), and internal read data can be accurately transmitted even when read drivers RDR in the memory blocks are coupled in common to global read data line GDOC. In addition, only read driver RDR of each column circuit is coupled to global read data line GDOC, of which load can be decreased even when global read data line GDOC is made longer, and global read data line GDOC can be driven with the large current driving power by read driver RDR, achieving high-speed data reading.

[Modification]

Figure 19:
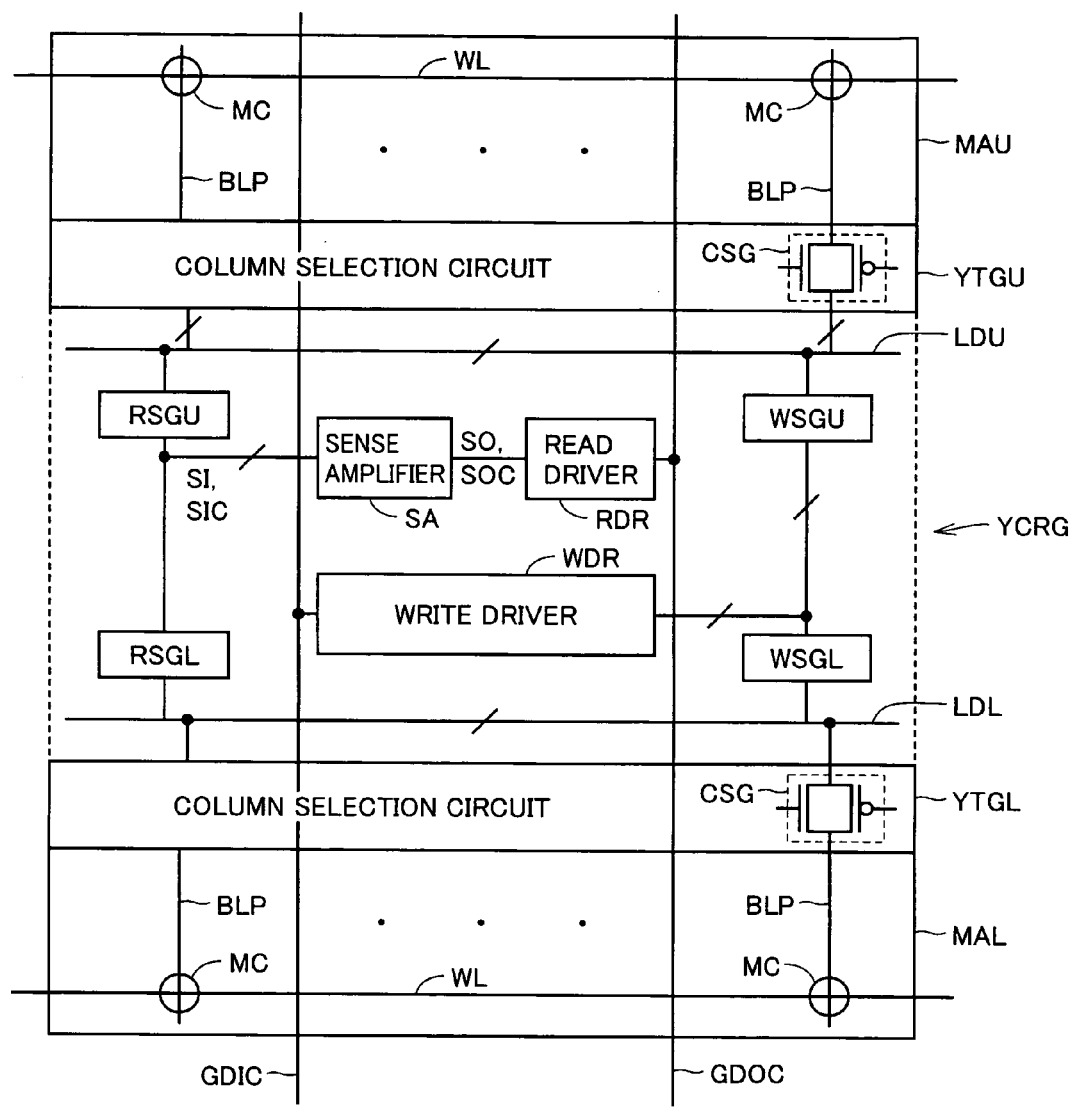
FIG. 19 shows a modification of a circuit arrangement shown in FIG. 18.

FIG. 19 schematically shows a modification of a circuit arrangement in the column circuit arrangement region of the semiconductor memory device according to the third embodiment of the present invention. In the circuit arrangement shown in FIG. 19, the sense read circuit formed with sense amplifier SA and read driver RDR is arranged in alignment with write driver WDR in the bit line extending direction in column circuit arrangement region YCRG. An output of read driver RDR is coupled to global read data line GDOC. An input of write driver WDR is coupled to global write data line GDIC. In the circuit arrangement shown in FIG. 19, global data lines GDOC and GDIC are shown being arranged opposite to each other relative to write driver WDR.

Although distances from sense input nodes SI and SIC of sense amplifier SA to respective subarrays MAU and MAL are slightly different, by arranging sense amplifier SA and read driver RDR in alignment with write driver WDR in the bit line extending direction, control signals from the local control circuit (LC) can be transmitted via separate regions respectively for a control signal for data writing and for a control signal for data reading. Such arrangement can prevent control signal transfer paths from becoming complicated and can simplify an interconnection layout, and a length of an interconnection for the control signals can be decreased to reduce a signal propagation delay.

In addition, as will be described below in detail, global data lines GDIC and GDOC are formed using interconnection lines of the same interconnection layer as, for example, a power supply line or a ground line (for supplying the power supply voltage or the ground voltage to the memory cell). A plurality of columns of memory cells MCs are arranged in subarrays MAU and MAL. Although an interconnection layout of a memory cell power supply/ground line (the power supply line or ground line) is determined according to a layout of the memory cell columns and a control method of the power supply voltage/ground voltage of the memory cells, global data lines GDIC and GDOC can be arranged without adversely affecting the layout of the memory cell power supply/ground line by arranging global data lines GDIC and GDOC in a remaining region of the memory cell power supply/ground line, for example, in an interconnection layer above the bit lines and in parallel with the bit lines.

It is to be noted that, in the control method of the memory cell power supply voltage/ground voltage described above, a level of the power supply voltage or ground voltage of the memory cell of a selected column is changed from that in the non-selected state (standby state) to speed up reading/writing for the memory cell. The memory cell power supply voltage or ground voltage is controlled for each memory cell column. In addition, such a construction may be employed, in which the memory cell power supply voltage and ground voltage are continuously maintained at constant voltage levels regardless of the selected/non-selected state of the memory cell column (in this scheme, the memory cell power supply line and the memory cell ground line are arranged extending in a column direction).

Figure 20:
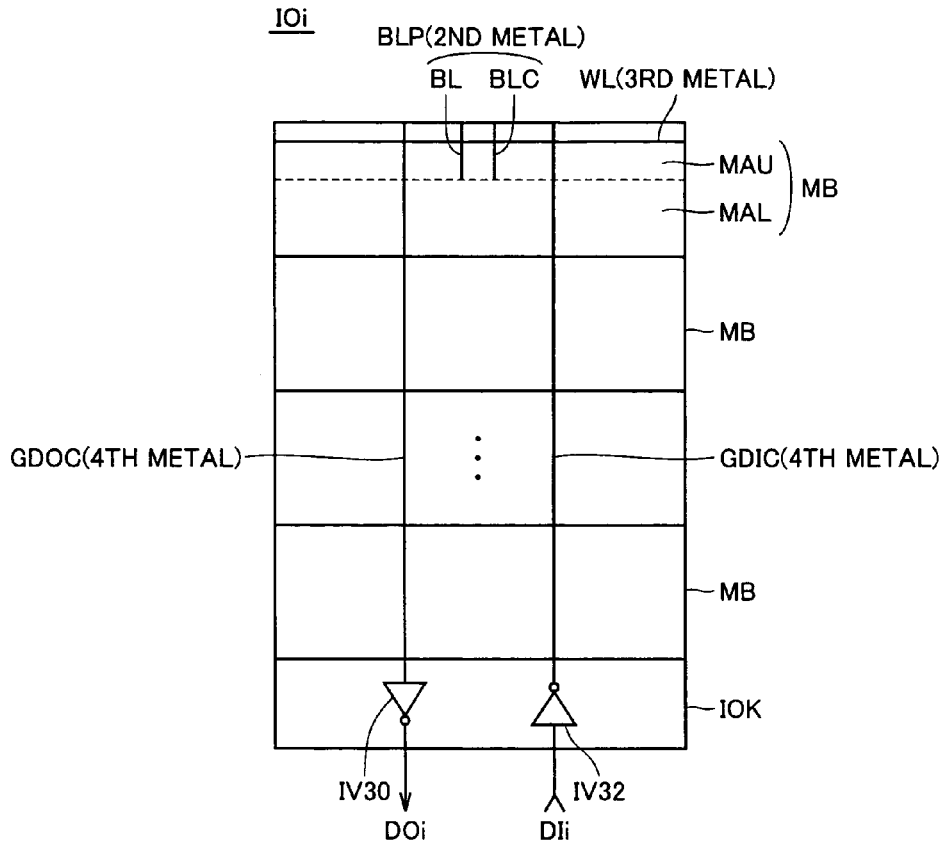
FIG. 20 schematically shows an arrangement of a global data line, a word line and a bit line in the third embodiment of the present invention.

FIG. 20 schematically shows a relation of interconnection layers of the semiconductor memory device according to the third embodiment of the present invention. FIG. 20 shows an interconnection layout of the IO block for 1 bit data DOi and DIi. A plurality of memory blocks MBs are arranged in an IO block IOi aligned in the bit line extending direction. Each memory block MB includes subarrays MAU and MAL. The column circuit arrangement region is not shown in FIG. 20 for simplifying the drawing.

In subarray MAU (and MAL), bit line pair BLP (bit lines BL, BLC) is arranged and word line WL is arranged in a direction intersecting with bit lines BL and BLC. Bit lines BL and BLC are each formed of a second metal interconnection line, and word line WL is formed of a third metal interconnection line. The second metal interconnection line used herein means an interconnection line of a second metal interconnection layer counted from a lowest metal interconnection layer. A first metal interconnection line is utilized to connect internal nodes (storage nodes) of the memory cells.

Global data lines GDOC and GDIC are each formed of a fourth metal interconnection line located at a layer above word line WL. Global data lines GDOC and GDIC are coupled respectively to inverter buffers IV30 and IV32 included in 1 bit input/output circuit IOK. Data DOi and DIi are output and input by inverters IV30 and IV32.

Although inverters IV30 and IV32 are utilized in input/output circuit IOK as an output buffer and an input buffer in FIG. 20, the buffer circuits shown in FIGS. 9 and 10 may also be utilized.

Although an arrangement of the memory cell power supply/ground line is determined according to the structure of the memory cell and the control scheme of the memory power supply/ground voltage, such a construction may be employed, in which both of the memory cell power supply line and ground line are formed of the fourth metal interconnection lines, or in which one of the memory cell power supply line and ground line is formed using the fourth metal interconnection line to extend in the column direction and the other one is formed using the third metal interconnection line to extend in the same direction as word line WL. In this embodiment, specific construction and arrangement of the memory cell power supply line/ground line is of less significance, and any interconnection arrangement for the memory power source may be employed.

Figure 21:
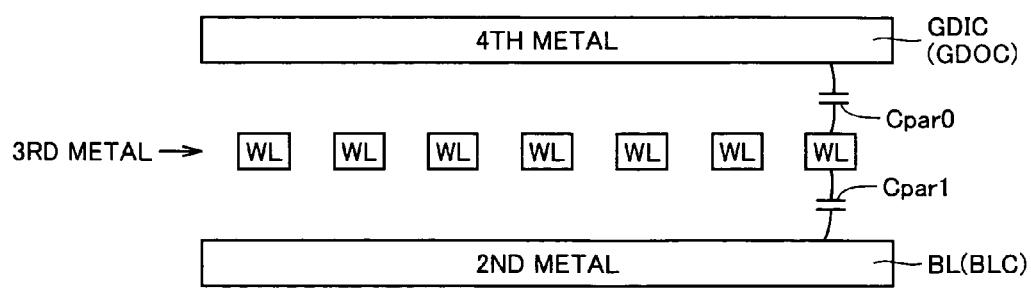
FIG. 21 shows a positional relation of interconnections shown in FIG. 20 in a direction of a height.

FIG. 21 schematically shows a positional relation of global data line GDIC (or GDOC), word line WL and bit line BL (or BLC) shown in FIG. 20 in a direction of a height. Bit line BL (and BLC) is formed of the second metal interconnection line, and word line WL is formed of the third metal interconnection line extending in a direction intersecting with bit line BL (and BLC). Global data line GDIC (or GDOC) formed using the fourth metal interconnection line is arranged in a layer above word line WL. Global data line GDIC (or GDOC) and bit line BL (or BLC) are arranged extending in parallel in the column direction.

A parasitic capacitance Cpar0 exists between word line WL and global data line GDIC (or GDOC), and a parasitic capacitance Cpar1 exists between word line WL and bit line BL (or BLC). As shown in FIG. 10, global data lines GDIC and GDOC are driven by the tristate buffer or inverter buffer IV32 shown in FIG. 20 and read driver RDR shown in FIG. 5, 14 or 19, and have a voltage amplitude of the CMOS level (between the power supply voltage and the ground voltage). On the other hand, bit line BL (and BLC) has a small voltage amplitude during data reading, and only the voltage amplitude of the bit line of a selected column fully swings according to the write data in data writing. Therefore, when global data line GDIC (and GDOC) and bit line BL (and BLC) are formed in adjacent interconnection layers, even if they are arranged non-overlappingly with each other in a planar layout, a voltage variation of global data line GDIC (and GDOC) may be transmitted to the bit line through the parasitic capacitances therebetween to vary a potential of bit line BL or BLC, to possibly vary memory cell data.

By arranging at least one interconnection layer, that is, a layer for word line WL between global data line GDIC (and GDOC) and bit lines BL and BLC, such capacitance coupling between global data lines GDIC, GDOC and bit lines BL, BLC can be suppressed. That is, in operation, one of the plurality of word lines is driven into the selected state and the other word lines WLs are maintained in the non-selected state. Parasitic capacitances Cpr0 and Cpr1 are formed only by regions of crossing portions of global data lines GDIC and GDOC and bit lines BL and BLC, and have small capacitance values. Therefore, an effect of a voltage variation of the selected word line on global data line GDOC can be substantially neglected.

In addition, when word line WL is selected, word line WL has a voltage level fixed after driven to the selected state by the row decode circuit. Therefore, during the operation, the voltage levels of word lines WLs are fixed to a voltage level of the selected state and a voltage level of the non-selected state, and each word line WL functions as a shield layer to prevent the capacitance coupling between global data lines GDIC and GDOC and bit lines BL and BLC. Thus, even when the voltage levels of global data lines GDIC and GDOC fully swing, bit lines BL and BLC are not affected adversely and stable data writing and reading are enabled. In particular, data reading and writing can be performed without destroying (inverting) the memory cell data of any non-selected column.

Figure 22:
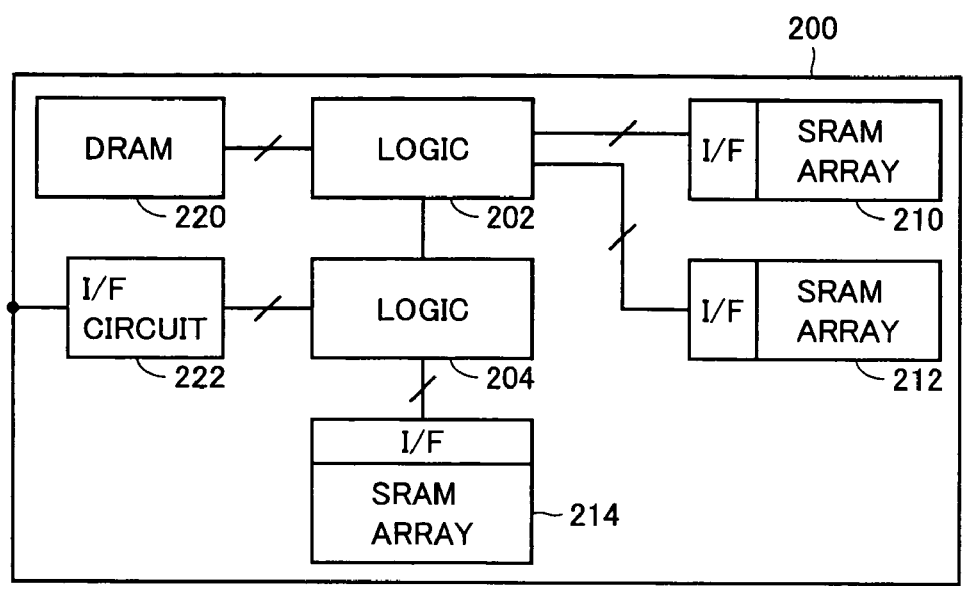
FIG. 22 shows an example of a construction of a system utilizing the semiconductor memory device according to the present invention.

FIG. 22 shows an example of a construction of a system utilizing the semiconductor memory device (SRAM) according to the present invention. In FIG. 22, logics 202 and 204 each performing a prescribed processing are provided on a common semiconductor chip 200. Logics 202 and 204 are each formed by a microprocessor or a DSP (digital signal processor), and are connected to each other via an internal bus. Logic 204 can communicate externally via an interface circuit (I/F) 222. SRAMs 210 and 212 are coupled in parallel to logic 202, and a large-capacity memory (DRAM: dynamic random access memory) 220 is also coupled thereto. An SRAM 214 is coupled to logic 204. Large-capacity memory 220 is utilized as a main memory for storing data and instructions. One of logics 202 and 204 may be utilized as a coprocessor for processing a specific routine of operational processing of the other logic. The logics may also concurrently perform different processings such as audio processing and image processing.

Each of SRAMs 210, 212 and 214 includes an interface portion I/F including data input/output circuit IOK and control circuit CTL shown in the first to third embodiments, and an SRAM array portion. A memory block (MB), a column circuit (YC), a row decode circuit (XD), and a local control circuit (LC) are arranged in the SRAM array portion. Each of logics 202 and 204 performs processing allocated in advance depending on a use of the system. Each of SRAMs 210, 212 and 214 is used as a memory for temporarily storing data/information, and is utilized as an instruction memory, a cache memory or a working memory.

As shown in FIG. 22, in a construction of the system on chip (SOC) in which one system is formed with the logic and the memory being integrated on semiconductor chip 200, data, addresses and control signals for SRAMs 210, 212 and 214 are all transferred via interface portion I/F. Therefore, SRAMs 210, 212 and 214, having the layout of the memory array of one of the first to third embodiments applied, can be arranged on chip 200 depending on arrangement positions of logics 202 and 204. When the SRAM is to be arranged on either side of logic 202, for example, the SRAM is merely required to be arranged with a mirror-inverted layout of a layout of an SRAM (macro) having a basic array layout, and therefore a new layout is not needed to form and designing efficiency is improved. In addition, corresponding to an arrangement position, the SRAM can be arranged in a desired position around the logic so as to arrange interface portion I/F thereof adjacent and facing to the corresponding logic by rotating the SRAM having the basic layout.

As described above, according to the third embodiment of the present invention, each IO block is divided into a plurality of memory blocks in the bit line extending direction, each memory block is divided into subarrays, the sense read circuit and the write driver (the internal write circuit) are arranged in the region between the subarrays, and the global data line is arranged extending over the memory blocks and the column circuits. Therefore, in addition to the effect of the first embodiment, a layout area of the IO block can be reduced and, accordingly, a layout area of the semiconductor memory device can be reduced.

The present invention can be applied to a static semiconductor memory device to implement high-speed data reading. The SRAM is not limited to a clock synchronous SRAM which operates in synchronization with clock signal CLK, and it may be a SRAM operating asynchronously to the clock signal. The present invention can also be applied to a burst SRAM which successively reads data of consecutive addresses in synchronization with the clock signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a plurality of memory blocks, arranged corresponding to one data bit, each including first and second subarrays each including a plurality of static memory cells arranged in rows and columns and a plurality of bit line pairs, arranged corresponding to respective memory cell columns, each being connected with the memory cells of a corresponding column;
first and second data line pairs arranged, for each of the memory blocks, corresponding to the first and second subarrays, respectively;
a first column selection circuit arranged, for each of said memory blocks, corresponding to said first subarray for coupling a bit line pair of a selected column of said first subarray to said first data line pair according to a received column selection signal;
a second column selection circuit arranged, for each of said memory blocks, corresponding to said second subarray for coupling a bit line pair of a selected column of said second subarray to said second data line pair according to a received column selection signal;
a data line selection circuit arranged, for each of said memory blocks, in a column circuit region arranged between and in alignment with the first and second subarrays for selecting one of said first and second data line pairs according to at least a subarray selection signal selecting subarray;
a sense read circuit arranged, for each of said memory blocks, in a said column circuit region for amplifying data applied via said data line selection circuit when activated;

an internal write circuit arranged, for each of said memory blocks, in said column circuit region between the first and second subarrays for transmitting internal write data to a data line pair selected by said data line selection circuit; and a global data bus arranged in common to said plurality of memory blocks and coupled in common to the sense read circuit and the internal write circuit of each of said memory blocks, for transferring internal data including said internal write data.

2. The semiconductor memory device according to claim 1, wherein said global data bus includes a write global data line coupled to said internal write circuit for transferring said internal write data and a read global data line coupled to said sense read circuit for transferring an output signal of the sense read circuit being activated.

3. The semiconductor memory device according to claim 1, wherein said global data is arranged extending over said plurality of memory blocks and said column circuit region.

4. The semiconductor memory device according to claim 1, further said sense read circuit includes a sense amplifier arranged in said column circuit region in a position substantially equal in distance to the first and second subarrays, for amplifying data transferred via a data line pair selected by said data line selection circuit, and a read drive circuit for driving said global data bus according to an output signal of said sense amplifier.

* * * * *